(12) United States Patent
Kang et al.

(10) Patent No.: US 12,532,608 B2
(45) Date of Patent: Jan. 20, 2026

(54) DISPLAY DEVICE

(71) Applicant: Samsung Display Co., Ltd., Yongin-si (KR)

(72) Inventors: Jangmi Kang, Seoul (KR); Hyeongseok Kim, Hwaseong-si (KR); Junhyun Park, Suwon-si (KR); Minjae Jeong, Hwaseong-si (KR); Mukyung Jeon, Ulsan (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 620 days.

(21) Appl. No.: 17/953,713

(22) Filed: Sep. 27, 2022

(65) Prior Publication Data

US 2023/0200137 A1 Jun. 22, 2023

(30) Foreign Application Priority Data

Dec. 16, 2021 (KR) ........................ 10-2021-0181089

(51) Int. Cl.
*H10K 59/121* (2023.01)
*G09G 3/3233* (2016.01)
(Continued)

(52) U.S. Cl.
CPC ....... *H10K 59/1216* (2023.02); *G09G 3/3233* (2013.01); *H10K 59/1213* (2023.02);
(Continued)

(58) Field of Classification Search
CPC .......... H10D 30/6731; H10D 30/6745; H10D 30/6755; H10D 30/6723; H10D 86/423; H10D 86/441; H10D 86/481; H10D 86/60; H10D 86/451; H10D 86/40; H10K 59/1216; H10K 59/1213; H10K 59/123; H10K 59/124; H10K 59/131; H10K 59/121; H10K 59/12; H10K 59/126; H10K 59/179; H10K 59/805; H10K 59/80515; H10K 59/8052;
(Continued)

(56) References Cited

U.S. PATENT DOCUMENTS 9,583,549 B2 2/2017 You
10,937,852 B2 3/2021 Hong et al.
(Continued)

FOREIGN PATENT DOCUMENTS

KR 1020160059003 A 5/2016
KR 1020190048591 A 5/2019

*Primary Examiner* — Natalia A Gondarenko
(74) *Attorney, Agent, or Firm* — CANTOR COLBURN LLP

(57) ABSTRACT

A pixel of a display device includes a light emitting element, a first transistor, a second transistor, a first capacitor, and a second capacitor. A gate electrode of the first transistor is disposed under the first insulating layer, and the gate electrode of the first transistor defines the first electrode of the first capacitor. A first conductive pattern defining a second electrode of the first capacitor and a first electrode of the second capacitor is interposed between a first insulating layer and a second insulating layer. A second conductive pattern defining a second electrode of the second capacitor is interposed between the second insulating layer and a third insulating layer. A second electrode of the second transistor is electrically connected to the first conductive pattern.

18 Claims, 26 Drawing Sheets

(51) Int. Cl.
*H10D 30/67* (2025.01)
*H10D 86/40* (2025.01)
*H10D 86/60* (2025.01)
*H10K 59/123* (2023.01)
*H10K 59/124* (2023.01)
*H10K 59/131* (2023.01)

(52) U.S. Cl.
CPC ......... *H10K 59/123* (2023.02); *H10K 59/124* (2023.02); *H10K 59/131* (2023.02); *G09G 2300/0426* (2013.01); *G09G 2300/0819* (2013.01); *G09G 2300/0852* (2013.01); *G09G 2310/08* (2013.01); *G09G 2330/028* (2013.01); *H10D 30/6731* (2025.01); *H10D 30/6745* (2025.01); *H10D 30/6755* (2025.01); *H10D 86/423* (2025.01); *H10D 86/441* (2025.01); *H10D 86/481* (2025.01); *H10D 86/60* (2025.01)

(58) Field of Classification Search
CPC ............. H10K 59/80521; H10K 59/82; H10K 59/8791; H10K 59/8792; H10K 59/88; H10K 50/895; H10K 50/81; H10K 50/813; H10K 50/82; H10K 50/822; H10K 50/86; H10K 50/865; G09G 2300/0426; G09G 2300/0819; G09G 2300/0852; G09G 2300/0861; G09G 3/3233; G09G 2310/0251; G09G 2310/08; G09G 2330/028; G09G 2320/043; H10H 29/142; H10H 20/857
USPC ...................................................... 257/40, 72
See application file for complete search history.

(56) References Cited

U.S. PATENT DOCUMENTS

| | | | | |
|---|---|---|---|---|
| 2018/0286307 | A1* | 10/2018 | Kim | G09G 3/3283 |
| 2019/0148477 | A1* | 5/2019 | Park | H10K 59/1213 |
| | | | | 257/40 |
| 2019/0393291 | A1* | 12/2019 | Jeon | G09G 3/3233 |
| 2020/0135091 | A1* | 4/2020 | Kim | G09G 3/3233 |

* cited by examiner

DISPLAY DEVICE

This application claims priority to Korean Patent Application No. 10-2021-0181089, filed on Dec. 16, 2021, and all the benefits accruing therefrom under 35 U.S.C. § 119, the content of which in its entirety is herein incorporated by reference.

BACKGROUND

1. Field

Embodiments of the disclosure described herein relate to a display device including pixels.

2. Description of the Related Art

A display device includes a plurality of pixels that display an image. Each of the pixels may include a light emitting device, at least one thin film transistor for driving the light emitting device, and a capacitor. The thin film transistor and the capacitor may control the light emitting device based on an electrical signal provided from a driving circuit.

SUMMARY

Embodiments of the disclosure provide a display device capable of sufficiently securing the capacitance of a capacitor in a pixel.

According to an embodiment, a display device includes a display panel including a plurality of insulating layers, and a pixel electrically connected to a data line and a scan line. In such an embodiment, the pixel includes a light emitting element, a first transistor including a first electrode, a second electrode electrically connected to the light emitting element, and a gate electrode connected to a first node, a second transistor including a first electrode connected to the data line, a second electrode connected to a second node, and a gate electrode electrically connected to the scan line, a first capacitor defined by the gate electrode of the first transistor and a first conductive pattern, and a second capacitor defined by the first conductive pattern and a second conductive pattern. In such an embodiment, the plurality of insulating layers include a first insulating layer, a second insulating layer disposed on the first insulating layer, and a third insulating layer disposed on the second insulating layer. In such an embodiment, the first conductive pattern is interposed between the first insulating layer and the second insulating layer. In such an embodiment, the second conductive pattern is interposed between the second insulating layer and the third insulating layer. In such an embodiment, the second electrode of the second transistor is electrically connected to the first conductive pattern.

In an embodiment, a first opening may be defined through the second conductive pattern.

In an embodiment, the pixel may further include a first connection electrode disposed in the first opening and electrically connected to the first conductive pattern and the second electrode of the second transistor.

In an embodiment, the second electrode of the second transistor may be connected to the first connection electrode through a first contact hole defined through the third insulating layer.

In an embodiment, the gate electrode of the first transistor, the first conductive pattern, and the second conductive pattern may overlap one another in a thickness direction of the display panel.

In an embodiment, each of the first transistor and the second transistor may include a semiconductor area. In such an embodiment, the semiconductor area of the first transistor may include a silicon semiconductor, and the semiconductor area of the second transistor may include metal oxide.

In an embodiment, the pixel may further include a third transistor including a first electrode connected to the first node, a second electrode, a semiconductor area, and a gate electrode electrically connected to the scan line.

In an embodiment, a second opening may be defined through the second conductive pattern, and a third opening may be defined through the first conductive pattern. In such an embodiment, the second opening may overlap the third opening in a thickness direction of the display panel.

In an embodiment, the pixel may further include a first connection electrode disposed in the first opening and electrically connected to the first conductive pattern to the second electrode of the second transistor, and a second connection electrode disposed in the second opening and electrically connected to the first connection electrode. In such an embodiment, the first connection electrode may be electrically connected to the gate electrode of the first transistor through a contact hole defined through the first insulating layer. In such an embodiment, the first electrode of the third transistor may be electrically connected to the second connection electrode through a second contact hole defined through the third insulating layer.

In an embodiment, the semiconductor area of the third transistor may include metal oxide.

In an embodiment, the pixel may further include a fourth transistor including a first electrode connected to the second electrode of the first transistor, a second electrode connected to the second electrode of the third transistor, and a gate electrode connected to another scan line.

In an embodiment, the pixel may further include a third capacitor connected between the second node and another scan line.

According to an embodiment, a display device includes a display panel including a plurality of insulating layers, and a pixel electrically connected to a data line, a first scan line and a second scan line. In such an embodiment, the pixel includes a light emitting element, a first transistor including a first electrode, a second electrode electrically connected to the light emitting element, and a gate electrode connected to a first node, a second transistor including a first electrode connected to the data line, a second electrode connected to the first electrode of the first transistor, and a gate electrode electrically connected to the first scan line, a third transistor including a first electrode connected to the first electrode of the first transistor, a second electrode, and a gate electrode electrically connected to the second scan line, a first capacitor defined by the gate electrode of the first transistor and a first conductive pattern, and a second capacitor defined by the first conductive pattern and a second conductive pattern. In such an embodiment, the plurality of insulating layers include a first insulating layer, a second insulating layer disposed on the first insulating layer, and a third insulating layer disposed on the second insulating layer. In such an embodiment, the gate electrode of the first transistor is disposed under the first insulating layer. In such an embodiment, the first conductive pattern is interposed between the first insulating layer and the second insulating layer. In such an embodiment, the second conductive pattern is interposed between the second insulating layer and the third insulating layer. In such an embodiment, the second electrode of the third transistor is electrically connected to the first conductive pattern.

In an embodiment, a first opening may be defined through the second conductive pattern.

In an embodiment, the pixel may further include a first connection electrode disposed in the first opening and electrically connected the first conductive pattern and the second electrode of the third transistor.

In an embodiment, the second electrode of the third transistor may be connected to the first connection electrode through a first contact hole defined through the third insulating layer.

In an embodiment, the gate electrode of the first transistor, the first conductive pattern, and the second conductive pattern may overlap one another in a thickness direction of the display panel.

In an embodiment, each of the first to third transistors may include a semiconductor area. In such an embodiment, each of the semiconductor area of the first transistor and the semiconductor area of the second transistor may include a silicon semiconductor. In such an embodiment, the semiconductor area of the third transistor may include metal oxide.

In an embodiment, the pixel further may further include a fourth transistor including a first electrode connected to the first node, a second electrode, a semiconductor area, and a gate electrode electrically connected to the second scan line.

In an embodiment, a second opening may be defined through the second conductive pattern, and a third opening may be defined through the first conductive pattern. In such an embodiment, the pixel may further include a first connection electrode disposed in the first opening and electrically connected to the first conductive pattern and the second electrode of the third transistor, and a second connection electrode disposed in the second opening and electrically connected to the first connection electrode. In such an embodiment, the first connection electrode may be electrically connected to the gate electrode of the first transistor through a contact hole defined through the first insulating layer. In such an embodiment, the first electrode of the fourth transistor may be electrically connected to the second connection electrode through a second contact hole defined through the third insulating layer.

BRIEF DESCRIPTION OF THE DRAWINGS

The above and other features of the disclosure will become apparent by describing in detail embodiments thereof with reference to the accompanying drawings.

DETAILED DESCRIPTION

Figure 1:
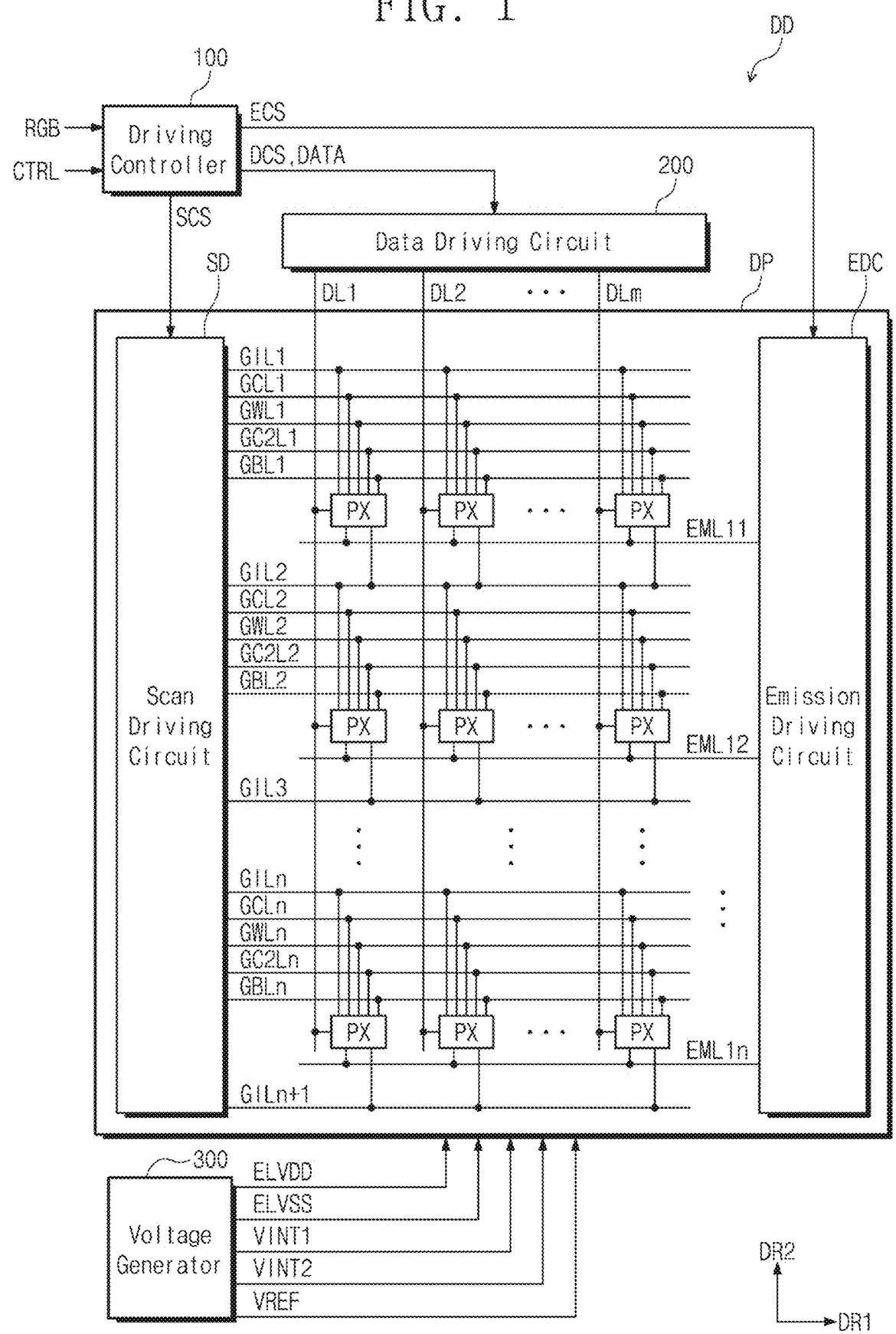
FIG. 1 is a block diagram of a display device, according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the specification, the expression that a first component (or region, layer, part, etc.) is "on", "connected with", or "coupled with" a second component means that the first component is directly on, connected with, or coupled with the second component or means that a third component is interposed therebetween.

Like reference numerals refer to like components. Also, in drawings, the thickness, ratio, and dimension of components are exaggerated for effectiveness of description of technical contents. "Or" means "and/or." The term "and/or" includes one or more combinations of the associated listed items.

Although the terms "first", "second", etc. may be used to describe various components, the components should not be construed as being limited by the terms. The terms are only used to distinguish one component from another component. For example, without departing from the scope and spirit of the disclosure, a first component may be referred to as a second component, and similarly, the second component may be referred to as the first component. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an."

Also, the terms "under", "beneath", "on", "above", etc. are used to describe a relationship between components illustrated in a drawing. The terms are relative and are described with reference to a direction indicated in the drawing.

It will be understood that the terms "include", "comprise", "have", etc. specify the presence of features, numbers, steps, operations, elements, or components, described in the specification, or a combination thereof, not precluding the presence or additional possibility of one or more other features, numbers, steps, operations, elements, or components or a combination thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical terms and scientific terms) used in this specification have the same meaning as commonly understood by those skilled in the art to which the disclosure belongs. Furthermore, terms such as terms defined in the dictionaries commonly used should be interpreted as having a meaning consistent with the meaning in the context of the related technology, and should not be interpreted in ideal or overly formal meanings unless explicitly defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to accompanying drawings.

FIG. 1 is a block diagram of a display device, according to an embodiment of the disclosure.

Referring to FIG. 1, an embodiment of a display device DD includes a display panel DP, a driving controller 100, a data driving circuit 200, and a voltage generator 300.

The driving controller 100 receives an input image signal RGB and a control signal CTRL. The driving controller 100 generates an output image signal DATA by converting a data format of the input image signal RGB to be suitable for the interface specification of the data driving circuit 200. The driving controller 100 outputs a scan control signal SCS, a data control signal DCS, and a light emitting driving control signal ECS.

The data driving circuit 200 receives the data control signal DCS and the output image signal DATA from the driving controller 100. The data driving circuit 200 converts the output image signal DATA into data signals and then outputs the data signals to a plurality of data lines DL1 to DLm to be described later. The data signals refer to analog voltages corresponding to a grayscale value of the output image signal DATA.

In an embodiment, the data driving circuit 200 may output one of a data signal corresponding to the output image signal DATA and a bias signal corresponding to a predetermined voltage level to data lines DL1 to DLm.

The voltage generator 300 generates voltages used to operate the display panel DP. In an embodiment, the voltage generator 300 generates a first driving voltage ELVDD (or a first voltage), a second driving voltage ELVSS (or a second voltage), a first initialization voltage VINT1, a second initialization voltage VINT2, and a reference voltage VREF. In an embodiment, the first initialization voltage VINT1 and the second initialization voltage VINT2 may have voltage levels different from each other. In an embodiment, the first initialization voltage VINT1 may have a same voltage level as the second initialization voltage VINT2. In an embodiment, the reference voltage VREF may have a same voltage level as the first driving voltage ELVDD.

The display panel DP includes scan lines GIL1 to GILn+1, GCL1 to GCLn, GWL1 to GWLn, GC2L1 to GC2Ln, and GBL1 to GBLn, emission control lines EML11 to EML1n, data lines DL1 to DLm, and pixels PX. Here, n and m are natural numbers. The display panel DP may further include a scan driving circuit SD and an emission driving circuit EDC. In an embodiment, the scan driving circuit SD may be arranged on a first side of the display panel DP. The scan lines GIL1 to GILn+1, GCL1 to GCLn, GWL1 to GWLn, GC2L1 to GC2Ln, and GBL1 to GBLn extend from the scan driving circuit SD in a first direction DR1.

The emission driving circuit EDC is arranged on a second side of the display panel DP. The emission control lines EML11 to EML1n extend from the emission driving circuit EDC in a direction opposite to the first direction DR1.

The scan lines GIL1 to GILn+1, GCL1 to GCLn, GWL1 to GWLn, GC2L1 to GC2Ln, and GBL1 to GBLn and the emission control lines EML11 to EML1n are arranged spaced from one another in a second direction DR2. The data lines DL1 to DLm extend from the data driving circuit 200 in a direction opposite to the second direction DR2, and are arranged spaced from one another in the first direction DR1.

In an embodiment, as shown in FIG. 1, the scan driving circuit SD and the emission driving circuit EDC are arranged to face each other with the pixels PX interposed therebetween, but the disclosure is not limited thereto. In an alternative embodiment, for example, the scan driving circuit SD and the emission driving circuit EDC may be positioned adjacent to each other on one of the first side and the second side of the display panel DP. In an embodiment, the scan driving circuit SD and the emission driving circuit EDC may be implemented with a single circuit.

The pixels PX are electrically connected to the scan lines GIL1 to GILn+1, GCL1 to GCLn, GWL1 to GWLn, GC2L1 to GC2Ln, and GBL1 to GBLn, the emission control lines EML11 to EML1n, and the data lines DL1 to DLm. Each of the pixels PX may be electrically connected to six scan lines and one emission control line. In an embodiment, for example, as shown in FIG. 1, the first row of pixels may be connected to the scan lines GIL1 GCL1, GWL1, GC2L1, GBL1, and GIL2 and the emission control line EML11. In such an embodiment, the second row of pixels may be connected to the scan lines GIL2, GCL2, GWL2, GC2L2, GBL2, and GIL3 and the emission control line EML12.

Each of the pixels PX includes a light emitting element ED (see FIG. 2) and a pixel circuit for controlling the emission of the light emitting element ED. The pixel circuit may include one or more transistors and one or more capacitors. The scan driving circuit SD and the emission driving circuit EDC may include transistors formed through a same process as transistors of the pixel circuit.

Each of the plurality of pixels PX receives the first driving voltage ELVDD, the second driving voltage ELVSS, the first initialization voltage VINT1, and the second initialization voltage VINT2 from the voltage generator 300.

The scan driving circuit SD receives the scan control signal SCS from the driving controller 100. The scan driving circuit SD may output scan signals to the scan lines GIL1 to GILn+1, GCL1 to GCLn, GWL1 to GWLn, and GC2L1 to GC2Ln in response to the scan control signal SCS.

The emission driving circuit EDC may output emission control signals to emission control lines EML11 to EML1n in response to the light emitting driving control signal ECS from the driving controller 100.

In an embodiment, the driving controller 100 may determine an operating frequency and may control the data driving circuit 200, the scan driving circuit SD, and the emission driving circuit EDC based on the determined operating frequency.

The driving controller 100, the data driving circuit 200, the scan driving circuit SD, and the emission driving circuit EDC may be collectively referred to as a "driving circuit" that drives the data lines DL1 to DLm, the scan lines GIL1 to GILn+1, GCL1 to GCLn, GWL1 to GWLn, GC2L1 to GC2Ln, and GBL1 to GBLn, and the emission control lines EML11 to EML1n, which are electrically connected to the pixels PX.

Figure 2:
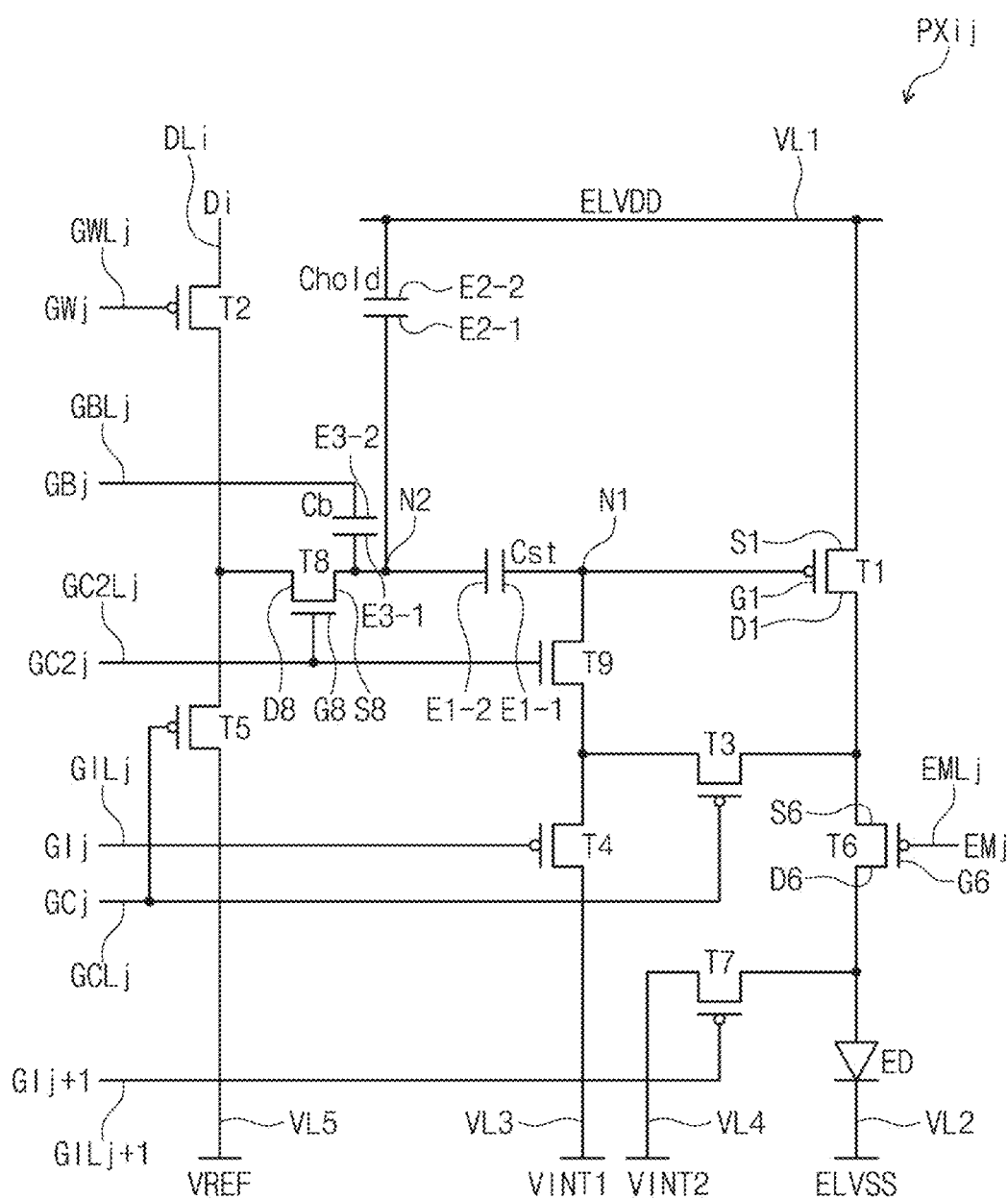
FIG. 2 is an equivalent circuit diagram of a pixel according to an embodiment of the disclosure.

FIG. 2 is an equivalent circuit diagram of a pixel according to an embodiment of the disclosure;

FIG. 2 illustrates a circuit diagram of a pixel PXij connected to an i-th data line DLi among the data lines DL1 to DLm, a j-th scan lines GILj, GCLj, GWLj, GC2Lj, and GBLj and a (j+1)-th scan line GILj+1 among the scan lines GIL1 to GILn+1, GCL1 to GCLn, GWL1 to GWLn, GC2L1 to GC2Ln, and GBL1 to GBLn, and a j-th emission control line EMLj among the emission control lines EML11 to EML1n, which are illustrated in FIG. 1.

Each of the pixels PX shown in FIG. 1 may have a same circuit configuration as each other, e.g., the circuit diagram of the pixel PXij shown in FIG. 2.

Referring to FIG. 2, an embodiment of a pixel PXij of a display device includes at least one light emitting element ED and a pixel circuit. The pixel circuit may include first to ninth transistors T1, T2, T3, T4, T5, T6, T7, T8, and T9 and first to third capacitors Cst, Chold, and Cb. In an embodiment, the light emitting element ED may be a light emitting diode.

In an embodiment, some of the first to ninth transistors T1 to T9 are P-type transistors having low-temperature polycrystalline silicon (LTPS) as a semiconductor layer. The other(s) of the first to ninth transistors T1 to T9 may be an N-type transistor having an oxide semiconductor as a semiconductor layer.

In an embodiment, each of the first to seventh transistors T1 to T7 is a P-type transistor, and each of the eighth transistor T8 and the ninth transistor T9 is an N-type transistor.

Embodiments of a circuit configuration of the pixel PXij are not limited to an embodiment in FIG. 2. The pixel PXij illustrated in FIG. 2 is only an example, and the circuit configuration of the pixel PXij may be variously modified and implemented.

The scan lines GILj, GCLj, GWLj, GC2Lj, GBLj, and GILj+1 may deliver scan signals GIj, GCj, GWj, GC2j, GBj, and GIj+1, respectively. The emission control line EMLj may deliver an emission control signal EMj. The data line DLi delivers a data signal Di. The data signal Di may have a voltage level corresponding to the input image signal RGB that is input to the display device DD (see FIG. 1). The first to fifth voltage lines VL1, VL2, VL3, VL4, and VL5 may deliver the first driving voltage ELVDD, the second driving voltage ELVSS, the first initialization voltage VINT1, the second initialization voltage VINT2, and the reference voltage VREF, respectively. The third voltage line VL3 and the fourth voltage line VL4 may be referred to as a "first initialization voltage line" and a "second initialization voltage line", respectively.

The first transistor T1 includes a first electrode S1 electrically connected to the first voltage line VL1, and a second electrode D1 electrically connected to an anode (or first electrode) of the light emitting element ED via the sixth transistor T6, and a gate electrode G1 connected to a first node N1. A cathode (or a second electrode) of the light emitting element ED may be connected to the second voltage line VL2.

The second transistor T2 includes a first electrode connected to the data line DLi, a second electrode, and a gate electrode connected to the scan line GWLj.

The third transistor T3 includes a first electrode connected to the second electrode of the first transistor T1, a second electrode, and a gate electrode connected to the scan line GCLj.

The fourth transistor T4 includes a first electrode connected to the second electrode of the third transistor T3, a second electrode connected to the third voltage line VL3, through which the first initialization voltage VINT1 is delivered, and a gate electrode connected to the scan line GILj.

The fifth transistor T5 includes a first electrode connected to the second electrode of the second transistor T2, a second electrode connected to the fifth voltage line VL5, and a gate electrode connected to the scan line GCLj.

The sixth transistor T6 includes a first electrode S6 connected to the second electrode D1 of the first transistor T1, a second electrode D6 connected to the anode of the light emitting element ED, and a gate electrode G6 connected to the emission control line EMLj.

The seventh transistor T7 includes a first electrode connected to the anode of the light emitting element ED, a second electrode connected to the fourth voltage line VL4, and a gate electrode connected to the scan line GILj+1. The seventh transistor T7 may be turned on in response to the scan signal GIj+1 received through the scan line GILj+1 such that the fourth initialization voltage line VL4 is electrically connected to the anode of the light emitting element ED. Accordingly, the current of the anode of the light emitting element ED may be bypassed to the fourth voltage line VL4 through the seventh transistor T7.

The eighth transistor T8 includes a first electrode D8 connected to the second electrode of the second transistor T2, a second electrode S8 connected to a second node N2, and a gate electrode G8 connected to the scan line GC2Lj.

The ninth transistor T9 includes a first electrode connected to the gate electrode G1 of the first transistor T1, a second electrode connected to the second electrode of the third transistor T3, and a gate electrode connected to the scan line GC2Lj.

The first capacitor Cst includes a first electrode E1-1 connected to the first node N1 and a second electrode E1-2 connected to the second node N2.

The second capacitor Chold includes a first electrode E2-1 connected to the second node N2 and a second electrode E2-2 connected to the first voltage line VL1.

The third capacitor Cb includes a first electrode E3-1 connected to the second node N2 and a second electrode E3-2 connected to the scan line GBLj.

In an embodiment, the pixel PXij may operate with various operating frequencies. In an embodiment, the pixel PXij may operate at one of a first operating frequency and a second operating frequency. The second operating frequency may be a lower frequency than the first operating frequency. In an embodiment, the first operating frequency may be about 120 hertz (Hz), and the second operating frequency may be about 60 Hz.

Figure 3A:
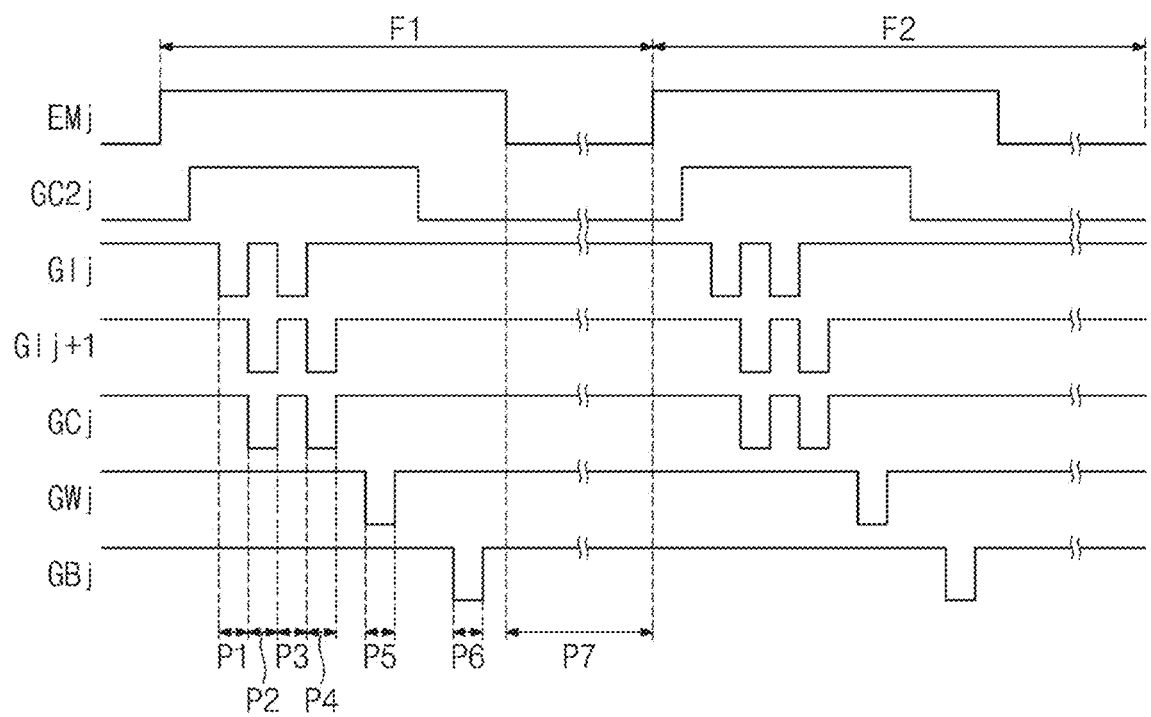
FIG. 3A is a timing diagram of scan signals and an emission control signal for describing an operation of a pixel when an operating frequency is a first operating frequency.

FIG. 3A is a timing diagram of scan signals and an emission control signal for describing an operation of a pixel when an operating frequency is a first operating frequency.

Figure 3B:
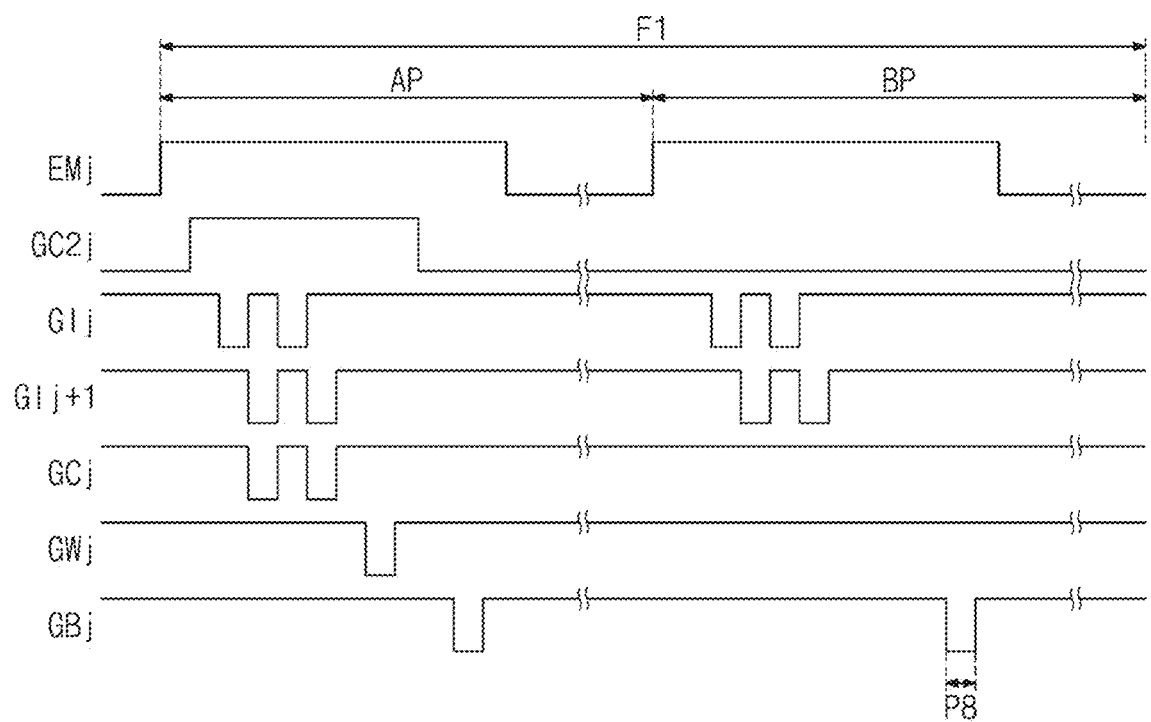
FIG. 3B is a timing diagram of scan signals and an emission control signal for describing an operation of a pixel when an operating frequency is a second operating frequency.

FIG. 3B is a timing diagram of scan signals and an emission control signal for describing an operation of a pixel when an operating frequency is a second operating frequency.

In FIGS. 3A and 3B, first to eighth periods P1 to P8 mean operating states or operating periods of the pixel PXij.

Referring to FIGS. 2 and 3A, when the scan signal GC2j is at a high level during first to fifth periods P1 to P5 of a first frame F1, the eighth transistor T8 and the ninth transistor T9 are turned on.

When the scan signal GIj is at a low level during each of the first period P1 and the third period P3, the fourth transistor T4 is turned on. Accordingly, the first initialization voltage VINT1 may be delivered to the first node N1 (i.e., a gate electrode of the first transistor T1) through the fourth transistor T4 and the ninth transistor T9. The first initialization voltage VINT1 may be a voltage for initializing the gate electrode of the first transistor T1.

The first period P1 and the third period P3 may be initialization periods for initializing the gate electrode of the first transistor T1 and an anode of the light emitting element ED.

When the scan signal GCj is at a low level during each of the second period P2 and the fourth period P4, the third transistor T3 is turned on. Accordingly, a voltage obtained by subtracting the first driving voltage ELVDD by a threshold voltage of the first transistor T1 may be provided to one end of the first capacitor Cst through the third transistor T3. Also, when the scan signal GCj is at the low level during each of the second period P2 and the fourth period P4, the reference voltage VREF may be provided to the second node N2 through the fifth transistor T5.

In the meantime, when the scan signal GIj+1 is at a low level during each of the second period P2 and the fourth period P4, the seventh transistor T7 is turned on. Accordingly, a current of the anode of the light emitting element ED may be discharged to the fourth voltage line VL4 through the seventh transistor T7. The second initialization voltage VINT2 provided through the fourth voltage line VL4 may be a voltage for initializing the anode of the light emitting element ED.

Each of the second period P2 and the fourth period P4 may be a compensation and bypass period for compensating for a threshold voltage (Vth) of the first transistor T1 and bypassing a current of the anode of the light emitting element ED.

The pixel PXij that alternately repeats the first period P1 and the third period P3 for initializing the gate electrode of the first transistor T1 and the second period P2 and the fourth period P4 for compensating for the threshold voltage (Vth) of the first transistor T1 and bypassing the current of the anode of the light emitting element ED may sufficiently secure initialization and compensation time. Accordingly, the data signal Di in the previous frame may have a minimal effect on the current frame.

FIG. 3A shows an embodiment where the pixel PXij alternately performs an initialization period and a compensation period twice in one frame, but the disclosure is not limited thereto. The number of times that the initialization period is repeated and the number of times that the compensation period is repeated may be variously changed.

When the scan signal GWj transitions to a low level during the fifth period P5, the second transistor T2 is turned on. A voltage level corresponding to the data signal Di of the data line DLi may be provided to the second node N2 through the second transistor T2 and the eighth transistor T8.

The fifth period P5 may be a write period for providing a voltage level corresponding to the data signal Di to the other end of the first capacitor Cst.

When the fifth period P5 ends, the scan signal GC2j transitions from a high level to a low level.

When the scan signal GBj transitions to the low level during the sixth period P6, the voltage level of the gate electrode of the first transistor T1 may be lowered by the voltage level of the scan signal GBj. The voltage level of the gate electrode of the first transistor T1 may be initialized by the scan signal GBj.

The sixth period P6 may be an initialization period for initializing the gate electrode of the first transistor T1.

When the emission control signal EMj transitions to a low level during the seventh period P7, a current path may be formed from the first voltage line VL1 to the light emitting element ED through the first transistor T1 and the sixth transistor T6.

The seventh period P7 may be an emission period of the light emitting element ED.

Because the scan signal GC2j is at a low level during the seventh period P7 that is the emission period, the eighth transistor T8 and the ninth transistor T9 are turned off. In an embodiment, the eighth transistor T8 and the ninth transistor T9 are N-type transistors, a leakage current may be minimized compared to a P-type transistor. Accordingly, a voltage between opposite ends of the first capacitor Cst may be maintained uniformly during the emission period.

The pixel PXij may operate during the second frame F2 in the same manner as the pixel PXij during the first frame F1.

Referring to FIGS. 2 and 3B, while the operating frequency is a second operating frequency, the first frame F1 includes an active period AP and a blank period BP.

The pixel PXij may operate during the active period AP in the same manner as the pixel PXij during the first frame F1 shown in FIG. 3A.

The pixel PXij does not receive the valid data signal Di during the blank period BP. That is, during the blank period BP, each of the scan signals GC2j, GCj, and GWj is maintained at an inactive level.

When the scan signal GBj transitions to a low level during the eighth period P8, the voltage level of the gate electrode of the first transistor T1 may be lowered by a voltage level of the scan signal GBj by the third capacitor Cb. That is, the gate electrode of the first transistor T1 is initialized by the scan signal GBj. Accordingly, a change in luminance of the light emitting element ED due to a hysteresis characteristic of the first transistor T1 may be minimized.

Figure 4:
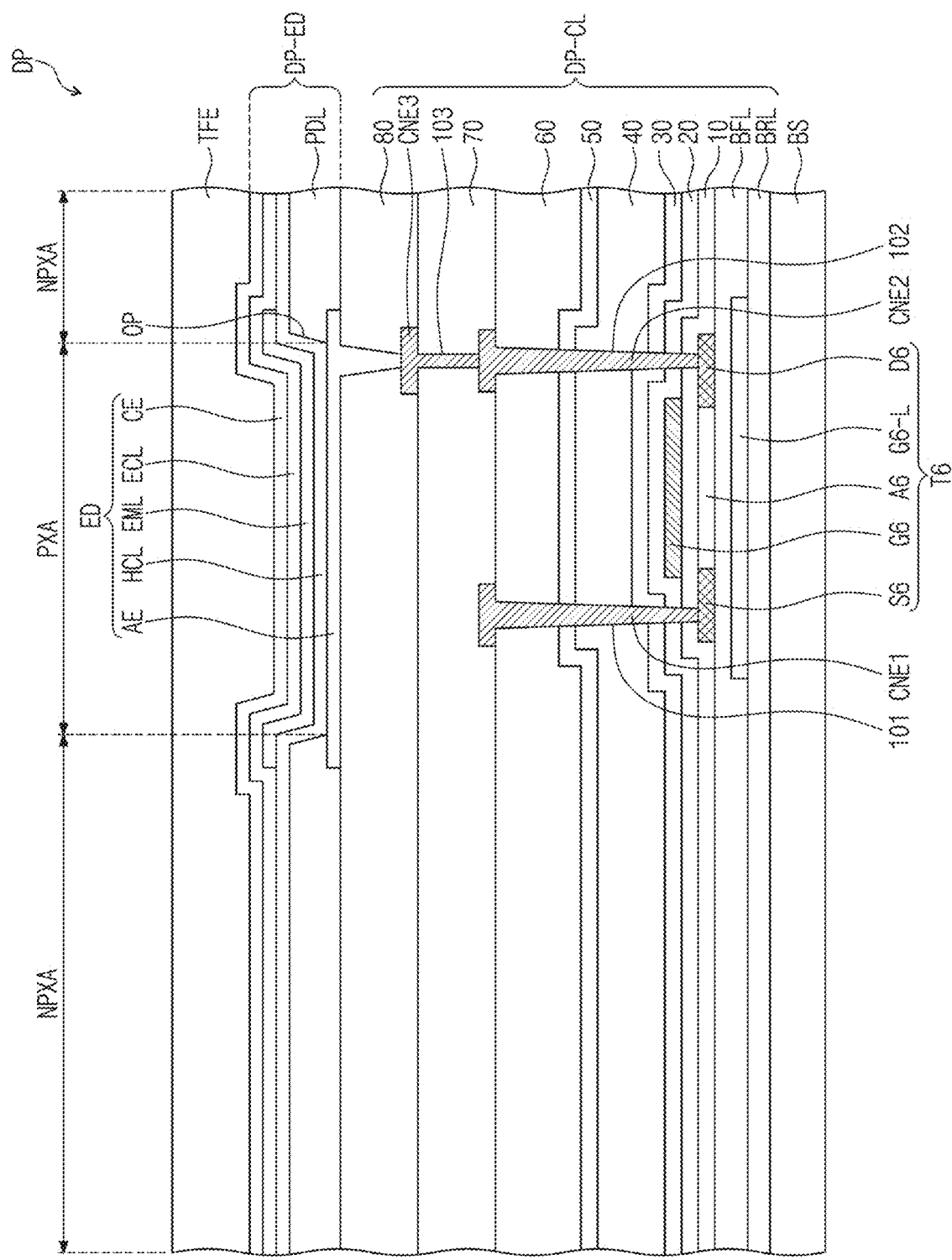
FIG. 4 is a cross-sectional view of a portion corresponding to corresponding to some configurations of a pixel of the display panel shown in FIG. 2.

FIG. 4 is a cross-sectional view of a portion corresponding to corresponding to some configurations of the pixel PXij of the display panel shown in FIG. 2.

Referring to FIGS. 2 and 4, an embodiment of the display panel DP may include a base layer BS, a circuit element layer DP-CL disposed on the base layer BS, a display element layer DP-ED, and a thin film encapsulation layer TFE. The display panel DP may further include functional layers such as an anti-reflection layer, a refractive-index adjustment layer, or the like. The circuit element layer DP-CL includes at least a plurality of insulating layers and a circuit element. The insulating layers described below may include an organic layer and/or an inorganic layer.

An insulating layer, a semiconductor layer, and a conductive layer are formed through processes such as a coating process, a deposition process, and the like. Afterward, the insulating layer, the semiconductor layer, and the conductive layer may be selectively patterned through photolithography and etching processes. A semiconductor pattern, a conductive pattern, and a signal line are formed through the processes. Patterns disposed in a same layer as each other may be formed through a same process.

The base layer BS may include a synthetic resin film. A synthetic resin layer may include a thermosetting resin. In an embodiment, the synthetic resin layer may be a polyimide-based resin layer, and a material thereof is not particularly limited. The synthetic resin layer may include at least one selected from acrylate-based resin, methacrylate-based resin, polyisoprene-based resin, vinyl-based resin, epoxy-based resin, urethane-based resin, cellulose-based resin, siloxane-based resin, polyamide-based resin, and perylene-based resin. Alternatively, the base layer BS may include a glass substrate, a metal substrate, an organic/inorganic composite substrate, or the like.

At least one inorganic layer is disposed on an upper surface of the base layer BS. The inorganic layer may include at least one selected from aluminum oxide, titanium oxide, silicon oxide, silicon nitride, silicon oxynitride, zirconium oxide, and hafnium oxide. The inorganic layer may be formed of or defined by multiple layers. The multiple inorganic layers may constitute a barrier layer BRL and/or a buffer layer BFL, which will be described later. The barrier layer BRL and the buffer layer BFL may be selectively provided or omitted.

The barrier layer BRL prevents foreign objects from being entered from the outside. The barrier layer BRL may include a silicon oxide layer and a silicon nitride layer. In an embodiment, the silicon oxide layer or the silicon nitride layer in the barrier layer BRL may be provided in plural. In such an embodiment, the silicon oxide layers and the silicon nitride layers may be alternately stacked one on another.

A lower gate electrode G6-L is disposed on the barrier layer BRL.

The buffer layer BFL covering the lower gate electrode G6-L is disposed on the barrier layer BRL. The buffer layer BFL improves a bonding force between the base layer BS and a semiconductor pattern and/or a conductive pattern. The buffer layer BFL may include a silicon oxide layer and a silicon nitride layer. The silicon oxide layer and the silicon nitride layer may be alternately stacked one on another.

A semiconductor layer is disposed on the buffer layer BFL. The semiconductor layer may include a plurality of semiconductor patterns. Each of the semiconductor patterns may include low-temperature polycrystalline silicon (LTPS).

In an embodiment, as shown in FIG. 4, the first electrode S6, a semiconductor area A6, and the second electrode D6 of the sixth transistor T6 are formed from or defined by the semiconductor patterns. The first electrode S6 and the second electrode D6 of the sixth transistor T6 extend in opposite directions from the semiconductor area A6.

The lower gate electrode G6-L has a function of a light blocking pattern. The lower gate electrode G6-L is disposed under the semiconductor area A6 of the sixth transistor T6 to block light incident from the outside. The light blocking pattern prevents external light from changing voltage-current characteristics of the sixth transistor T6.

A first insulating layer 10 is disposed on the buffer layer BFL.

A conductive layer (hereinafter, referred to as a "first conductive layer") is disposed on the first insulating layer 10. In an embodiment shown in FIG. 4, the gate electrode G6 is defined by a conductive pattern of the first conductive layer.

Second to sixth insulating layers 20 to 60 covering the gate electrode G6 of the sixth transistor T6 are sequentially disposed on the first insulating layer 10. Each of the second to sixth insulating layers 20 to 60 may be an inorganic layer and/or an organic layer.

A conductive layer (hereinafter, referred to as a "fifth conductive layer") is disposed on the sixth insulating layer 60. The fifth conductive layer may include a plurality of connection electrodes CNE1 and CNE2. Only the first and second connection electrodes CNE1 and CNE2 are illustrated in FIG. 4. However, the fifth conductive layer may further include conductive patterns. The first connection electrode CNE1 is connected to the first electrode S6 of the sixth transistor T6 through a contact hole 101 defined through the first to sixth insulating layers 10 to 60. The second connection electrode CNE2 is connected to the second electrode D6 of the sixth transistor T6 through a contact hole 102 defined through the first to sixth insulating layers 10 to 60.

A seventh insulating layer 70 covering the fifth conductive layer is disposed on the sixth insulating layer 60. In an embodiment, the seventh insulating layer 70 may be an organic layer and may have a single-layer structure, but is not particularly limited thereto.

A conductive layer (hereinafter, referred to as a "seventh conductive layer") is disposed on the seventh insulating layer 70. The seventh conductive layer may include a third connection electrode CNE3. The third connection electrode CNE3 is connected to the second connection electrode CNE2 through a contact hole 103 defined through the seventh insulating layer 70. Although not shown in FIG. 4, the seventh conductive layer may further include conductive patterns.

The seventh conductive layer may further include a data line DLj and the first voltage line VL1.

An eighth insulating layer 80 covering a sixth conductive layer is disposed on the seventh insulating layer 70. In an embodiment, the eighth insulating layer 80 may be an organic layer and may have a single-layer structure, but is not particularly limited thereto.

The first electrode AE of the light emitting element ED is disposed on the eighth insulating layer 80. The first electrode AE may be an anode. The first electrode AE is connected to the second connection electrode CNE2 through the contact hole 103 defined through the seventh insulating layer 70.

A pixel defining layer PDL is disposed on the eighth insulating layer 80. The opening OP is defined through the pixel defining layer PDL to expose at least part of the first electrode AE. The opening OP of the pixel defining layer PDL may define an emission area PXA. In an embodiment, for example, the plurality of pixels PX (see FIG. 1) may be arranged on a plane of the display panel DP (see FIG. 1) depending on a specific rule. An area in which the plurality of pixels PX are arranged may be defined as a pixel area. One pixel area may include the emission area PXA and a non-emission area NPXA adjacent to the emission area PXA. A non-emission area NPXA may surround the emission area PXA.

A hole control layer HCL may be disposed in common in the emission area PXA and the non-emission area NPXA. A common layer such as the hole control layer HCL may be provided in common in the plurality of pixels PX. The hole control layer HCL may include a hole transport layer and a hole injection layer.

A light emitting layer EML is disposed on the hole control layer HCL. The light emitting layer EML may be disposed in only an area corresponding to the opening OP. The light emitting layer EML may be separately formed in each of the plurality of pixels PX.

In an embodiment, the patterned light emitting layer EML is illustrated. Alternatively, the light emitting layer EML may be disposed in the plurality of pixels PX in common. The emission layer EML that is disposed in common may generate white light or blue light. In an embodiment, the light emitting layer EML may have a multi-layer structure.

An electron control layer ECL is disposed on the light emitting layer EML. The electron control layer ECL may include an electron transport layer and an electron injection layer. The second electrode CE is disposed on the electron control layer ECL. The electronic control layer ECL and the second electrode CE are disposed in the plurality of pixels PX in common.

The thin film encapsulation layer TFE is disposed on the second electrode CE. The thin film encapsulation layer TFE is disposed in the plurality of pixels PX in common. In an embodiment, the thin film encapsulation layer TFE directly covers the second electrode CE. In an embodiment of the disclosure, a capping layer directly covering the second electrode CE may be further disposed. In an embodiment of the disclosure, the stacked structure of the light emitting element ED may have a structure thus vertically inverted in the structure shown in FIG. 4.

The thin film encapsulation layer TFE includes at least one inorganic layer or at least one organic layer. In an embodiment, for example, the thin film encapsulation layer TFE may include two inorganic layers and an organic layer disposed therebetween. In an embodiment of the disclosure, the thin film encapsulation layer TFE may include a plurality of inorganic layers and a plurality of organic layers, which are alternately stacked one on another.

Figure 5:
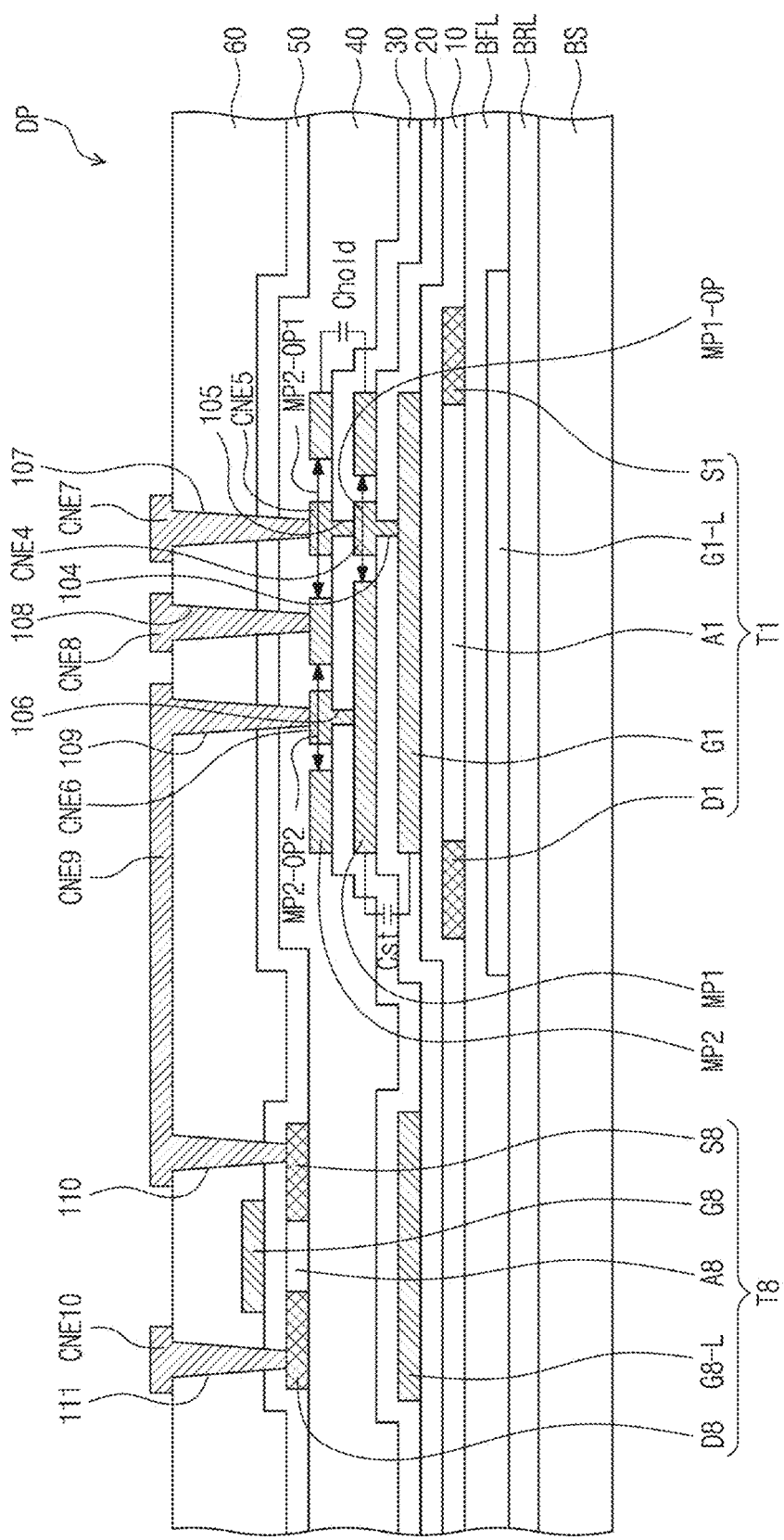
FIG. 5 is a cross-sectional view of a portion corresponding to corresponding to some configurations of a pixel of the display panel shown in FIG. 2.

FIG. 5 is a cross-sectional view of a portion corresponding to corresponding to some configurations of the pixel PXij of the display panel shown in FIG. 2. Hereinafter, any repetitive detailed description of the same or like elements as those described above with reference to FIG. 4 will be omitted or simplified to avoid redundancy.

Referring to FIG. 5, in an embodiment, a conductive layer (hereinafter, referred to as a "first conductive layer") is disposed on the barrier layer BRL. The first conductive layer may include a plurality of conductive patterns. FIG. 5 shows a partial pattern of the first conductive layer. It is illustrated that a lower gate electrode G1-L is defined by a conductive pattern of the first conductive layer.

The buffer layer BFL may be disposed on the barrier layer BRL to cover the lower gate electrodes G1-L. The buffer layer BFL improves a bonding force between the base layer BS and a semiconductor pattern and/or a conductive pattern. In an embodiment, the buffer layer BFL may include a silicon oxide layer and a silicon nitride layer. In such an embodiment, the silicon oxide layer and the silicon nitride layer may be alternately stacked one on another.

The first insulating layer 10 is disposed on the buffer layer BFL.

Another conductive layer (hereinafter, referred to as a "second conductive layer") is disposed on the first insulating layer 10. In FIG. 5, it is illustrated that the gate electrode G1 is defined by a conductive pattern of the second conductive layer.

The first electrode S1, a semiconductor area A1, and the second electrode D1 of the first transistor T1 are formed from or defined by the semiconductor patterns. The first electrode S1 and the second electrode D1 of the first transistor T1 extend in opposite directions from the semiconductor area A1.

The lower gate electrode G1-L has a function of a light blocking pattern. The lower gate electrode G1-L is disposed under the semiconductor area A1 of the first transistor T1 to block light incident from the outside. The light blocking pattern prevents external light from changing voltage-current characteristics of the first transistor T1.

A conductive layer is disposed on the barrier layer BRL. The conductive layer may include a plurality of conductive patterns. FIG. 5 shows a partial pattern of the conductive layer. It is illustrated that a lower gate electrode G1-L is defined by a conductive pattern of the conductive layer.

The second insulating layer 20 covering the gate electrode G1 of the first transistor T1 is disposed on the first insulating layer 10. The second insulating layer 20 may be an inorganic layer and/or an organic layer, and may have a single-layer structure or a multi-layer structure.

The gate electrode G1 of the first transistor T1 defines or functions as the first electrode E1-1 of the first capacitor Cst shown in FIG. 2.

Another conductive layer (hereinafter, referred to as a "third conductive layer") is disposed on the second insulating layer 20. The third conductive layer may include a plurality of conductive patterns. In an embodiment, the third conductive layer may include or define a lower gate electrode G9-L and a first conductive pattern MP1 of the ninth transistor T9. The lower gate electrode G9-L is spaced from the first conductive pattern MP1. In a cross-sectional view, the first conductive pattern MP1 overlaps the gate electrode G1 of the first transistor T1 in a thickness direction of the display panel DP.

The first conductive pattern MP1 defines a second electrode E1-2 of the first capacitor Cst and a first electrode E2-1 of the second capacitor Chold shown in FIG. 2.

An opening MP1-OP may be defined in the first conductive pattern MP1.

A fourth connection electrode CNE4 is connected to the gate electrode G1 of the first transistor T1 through a contact hole 104 defined through the second insulating layer 20. The fourth connection electrode CNE4 is disposed inside the opening MP1-OP.

The third insulating layer 30 covering the third conductive layer is disposed on the second insulating layer 20.

Another conductive layer (hereinafter, referred to as a "fourth conductive layer") is disposed on the third insulating layer 30. The fourth conductive layer may include a plurality of conductive patterns. In an embodiment, the fourth conductive layer may include a second conductive pattern MP2. In a cross-sectional view, the second conductive pattern MP2 overlaps the gate electrode G1 and the first conductive pattern MP1 of the first transistor T1.

The second conductive pattern MP2 defines the second electrode E2-2 of the second capacitor Chold shown in FIG. 2.

Openings MP2-OP1 and MP2-OP2 may be defined in the second conductive pattern MP2. In an embodiment, the opening MP2-OP1 of the second conductive pattern MP2 overlaps the opening MP1-OP of the first conductive pattern MP1.

A fifth connection electrode CNE5 is connected to the fourth connection electrode CNE4 through a contact hole 105 defined through the third insulating layer 30. The fifth connection electrode CNE5 is disposed inside the opening MP2-OP1.

A sixth connection electrode CNE6 is connected to the first conductive pattern MP1 through a contact hole 106 defined through the third insulating layer 30. The sixth connection electrode CNE6 is disposed inside the opening MP2-OP2.

The fourth insulating layer 40 covering the fourth conductive layer is disposed on the third insulating layer 30.

A semiconductor layer is disposed on the fourth insulating layer 40. The semiconductor layer may include a plurality of semiconductor patterns. The semiconductor pattern may include metal oxide. The metal oxide semiconductor may include a crystalline or amorphous oxide semiconductor. In an embodiment, for example, the oxide semiconductor may include at least one selected from oxides of metals (e.g., zinc (Zn), indium (In), gallium (Ga), tin (Sn), titanium (Ti), and the like) or at least one selected from a mixture of the metals (e.g., zinc (Zn), indium (In), gallium (Ga), tin (Sn), titanium (Ti), and the like). The oxide semiconductors may include indium-tin oxide (ITO), indium-gallium-zinc oxide (IGZO), zinc oxide (ZnO), indium-zinc oxide (IZnO), zinc-indium oxide (ZIO), indium oxide (InO), titanium oxide (TiO), indium-zinc-tin oxide (IZTO), zinc-tin oxide (ZTO), or the like.

The semiconductor pattern may include a plurality of areas identified depending on whether the metal oxide is reduced. An area (hereinafter referred to as a "reduction area") in which the metal oxide is reduced has higher conductivity than an area (hereinafter referred to as a "non-reduction area") in which the metal oxide is not reduced. The reduction area substantially serves as a first electrode (or source)/second electrode (or drain) or a signal line of a transistor. The non-reduction area substantially corresponds to a semiconductor area (or channel) of a transistor. In such an embodiment, a part of the semiconductor pattern may be the semiconductor area of the transistor; another part of the semiconductor pattern may be the first electrode/second electrode of the transistor; and the other part of the semiconductor pattern may be the signal transmission area.

In an embodiment, as shown in FIG. 5, the first electrode D8, a semiconductor area A8, and the second electrode S8 of the eighth transistor T8 are formed from or defined by the semiconductor patterns. The first electrode D8 and the second electrode S8 of the first transistor T8 extend in opposite directions from the semiconductor area A8.

The lower gate electrode G8-L has a function of a light blocking pattern. The lower gate electrode G8-L is disposed under the semiconductor area A8 of the eighth transistor T8 to block light incident from the outside. The light blocking pattern prevents external light from changing voltage-current characteristics of the eighth transistor T8.

The fifth insulating layer 50 covering the semiconductor pattern is disposed on the fourth insulating layer 40.

Another conductive layer (hereinafter, referred to as a "fifth conductive layer") is disposed on the fifth conductive layer 50. The fifth conductive layer may include a plurality of conductive patterns. In an embodiment, the fifth conductive layer may include the gate electrode G8 of the eighth transistor T8.

The sixth insulating layer 60 covering the gate electrode G8 of the eighth transistor T8 is disposed on the fifth insulating layer 50.

Another conductive layer (hereinafter, referred to as a "sixth conductive layer") is disposed on the sixth insulating layer 60. The sixth conductive layer may include seventh to tenth connection electrodes CNE7 to CNE10.

The seventh connection electrode CNE7 is connected to the fourth connection electrode CNE4 through a contact hole 107 defined through the fourth to sixth insulating layers 40 to 60. The seventh connection electrode CNE7 may be the first node N1 shown in FIG. 2.

The eighth connection electrode CNE8 is connected to the second conductive pattern MP2 through a contact hole 108 defined through the fifth and sixth insulating layers 50 and 60.

The ninth connection electrode CNE9 is connected to the sixth connection electrode CNE6 through a contact hole 109 defined through the fifth and sixth insulating layers 50 and 60. In addition, the ninth connection electrode CNE9 is connected to the second electrode S8 of the eighth transistor T8 through a contact hole 110 defined through the fifth and sixth insulating layers 50 and 60. The ninth connection electrode CNE9 may be the second node N2 illustrated in FIG. 2.

The tenth connection electrode CNE10 is connected to the first electrode D8 of the eighth transistor T8 through a contact hole 111 defined through the fifth to sixth insulating layers 50 and 60.

Figure 6:
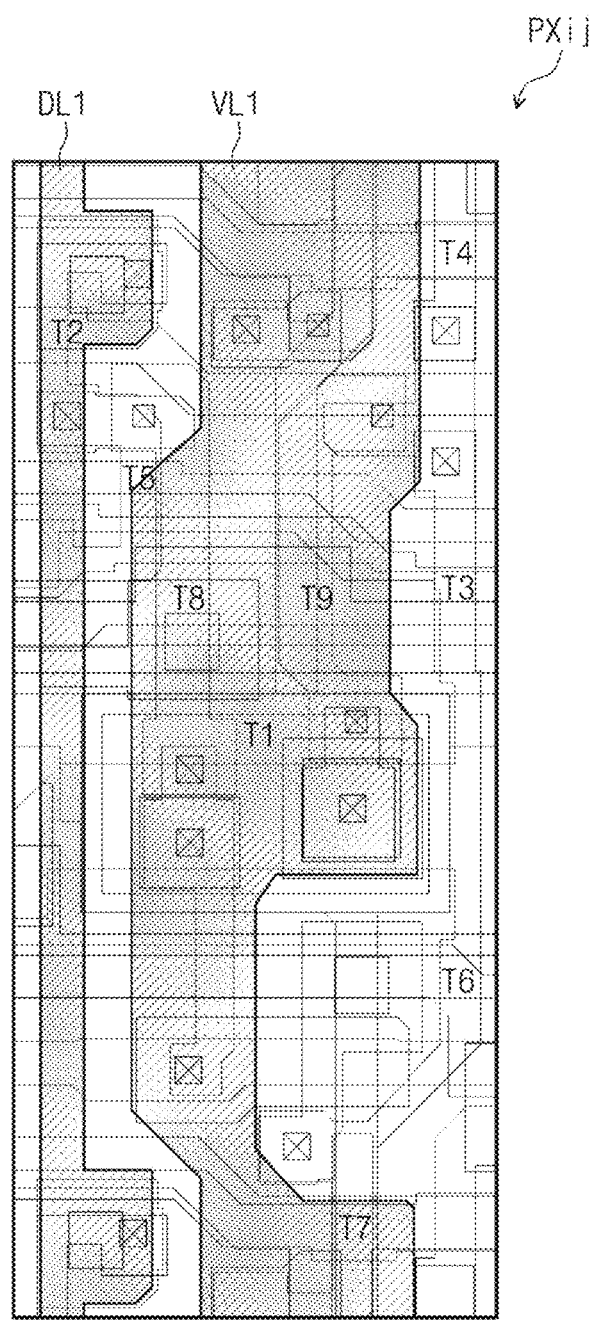
FIG. 6 is a plan view of a pixel, according to an embodiment of the disclosure.

FIG. 6 is a plan view of the pixel PXij, according to an embodiment of the disclosure. FIGS. 7A to 7G are plan views of patterns in a partial area of the pixel PXij, which are sequentially disposed one on another, according to an embodiment of the disclosure. Hereinafter, a detailed description of the same configuration as that described with reference to FIGS. 1 to 5 will be omitted or simplified to avoid redundancy.

Figure 7A:
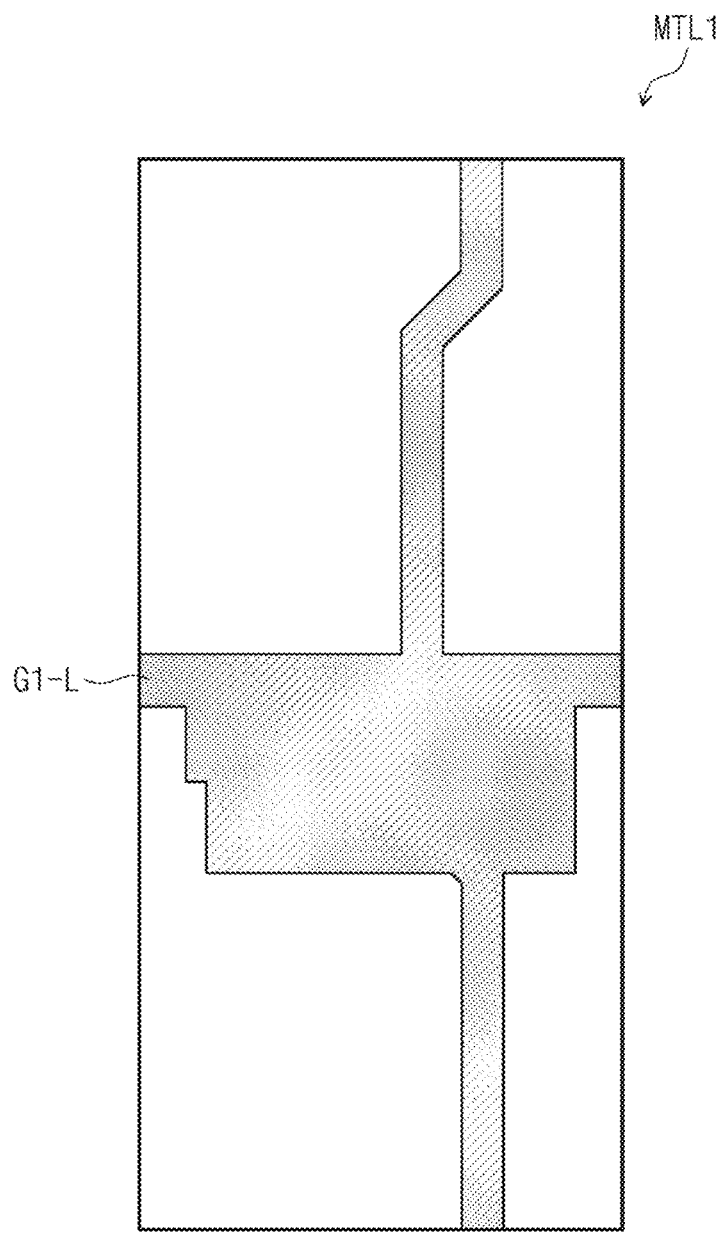
FIGS. 7A to 7J are plan views of patterns in a partial area of a pixel, which are sequentially disposed one on another, according to an embodiment of the disclosure.

Referring to FIGS. 6 and 7A, conductive patterns of a first conductive layer MTL1 are disposed on the base layer BS (see FIG. 5). The conductive pattern of the first conductive layer MTL1 may include the lower gate electrodes G1-L of the first transistor T1.

Figure 7B:
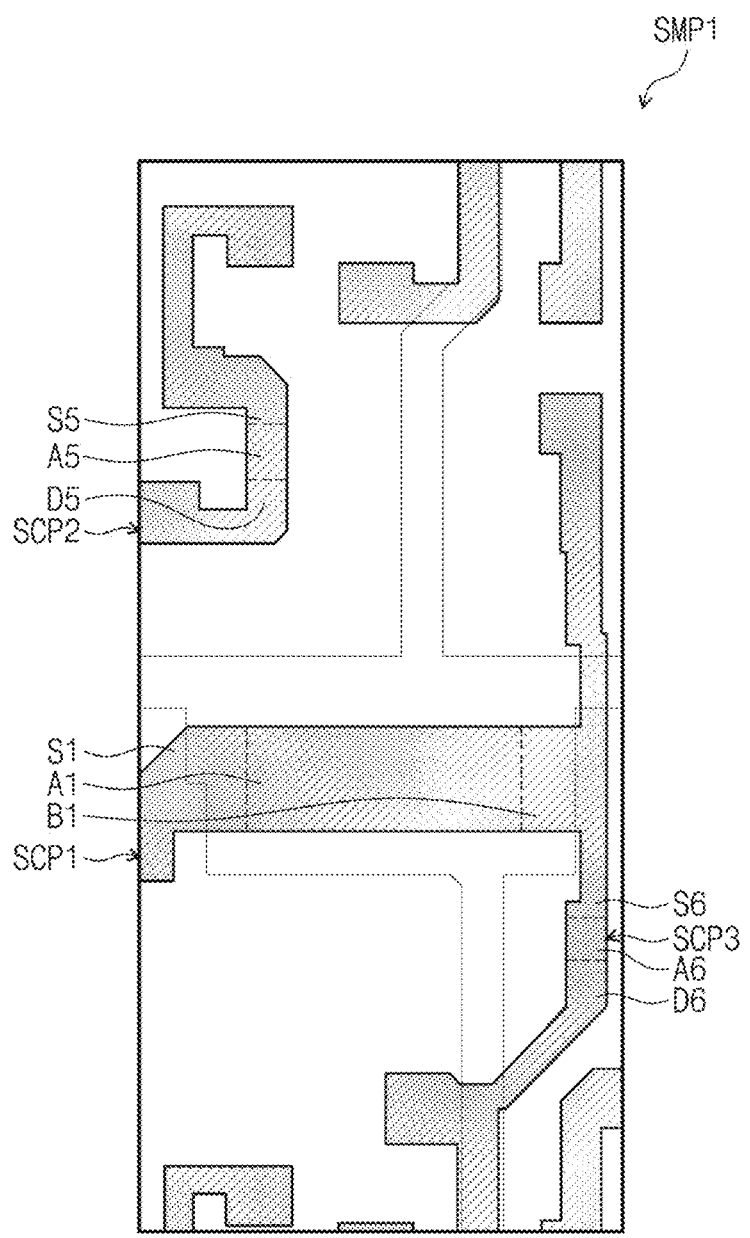

Referring to FIGS. 6 and 7B, semiconductor patterns of a first semiconductor layer SMP1 are disposed on the buffer layer BFL (see FIG. 5). The semiconductor patterns of the first semiconductor layer SMP1 may include first to third semiconductor patterns SCP1, SCP2, and SCP3 disposed to correspond to the pixel PXij.

The first semiconductor pattern SCP1 may include the first electrode S1, the semiconductor area A1, and the second electrode D1 of the first transistor T1. The second semiconductor pattern SCP2 may include a first electrode S5, a semiconductor area A5, and a second electrode D5 of the fifth transistor T5. The third semiconductor pattern SCP3 may include the first electrode S6, the semiconductor area A6, and the second electrode D6 of the sixth transistor T6.

The first electrode/second electrode/semiconductor area in the first to third semiconductor patterns SCP1, SCP2, and SCP3 shown in FIG. 7B are integrally formed with each other. After a reduction process is performed by using the gate electrodes G1, G5, and G6 described with reference to FIG. 7C as a mask, the first electrode/second electrode is distinguished from the semiconductor area.

Figure 7C:
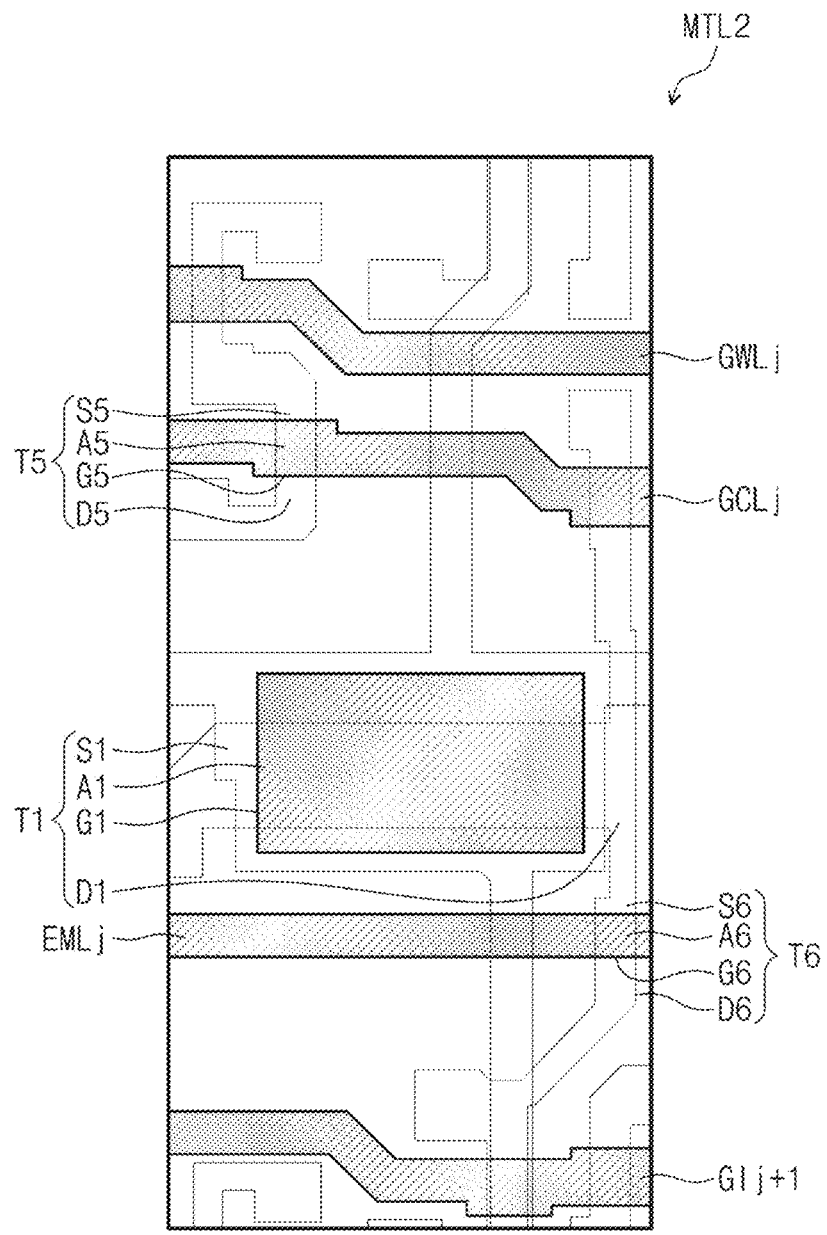

Referring to FIGS. 6 and 7C, conductive patterns of a second conductive layer MTL2 are disposed on the first insulating layer 10 (see FIG. 5). The conductive patterns of the second conductive layer MTL2 may include the gate electrodes (G1, G5) and the emission control line EMLj of the first and fifth transistors (T1, T5). A part of the emission control line EMLj corresponds to the gate electrode G6 of the sixth transistor T6. When a reduction process is performed by using the gate electrodes (G1, G5, G6) as a mask, first and second electrodes of each of the first to third semiconductor patterns (SCP1, SCP2, SCP3) have greater conductivity than the semiconductor area of each of the first to third semiconductor patterns (SCP1, SCP2, SCP3). After the reduction process is preformed, the first, fifth and sixth transistors T1, T5, and T6 having a switch function are provided.

Figure 7D:
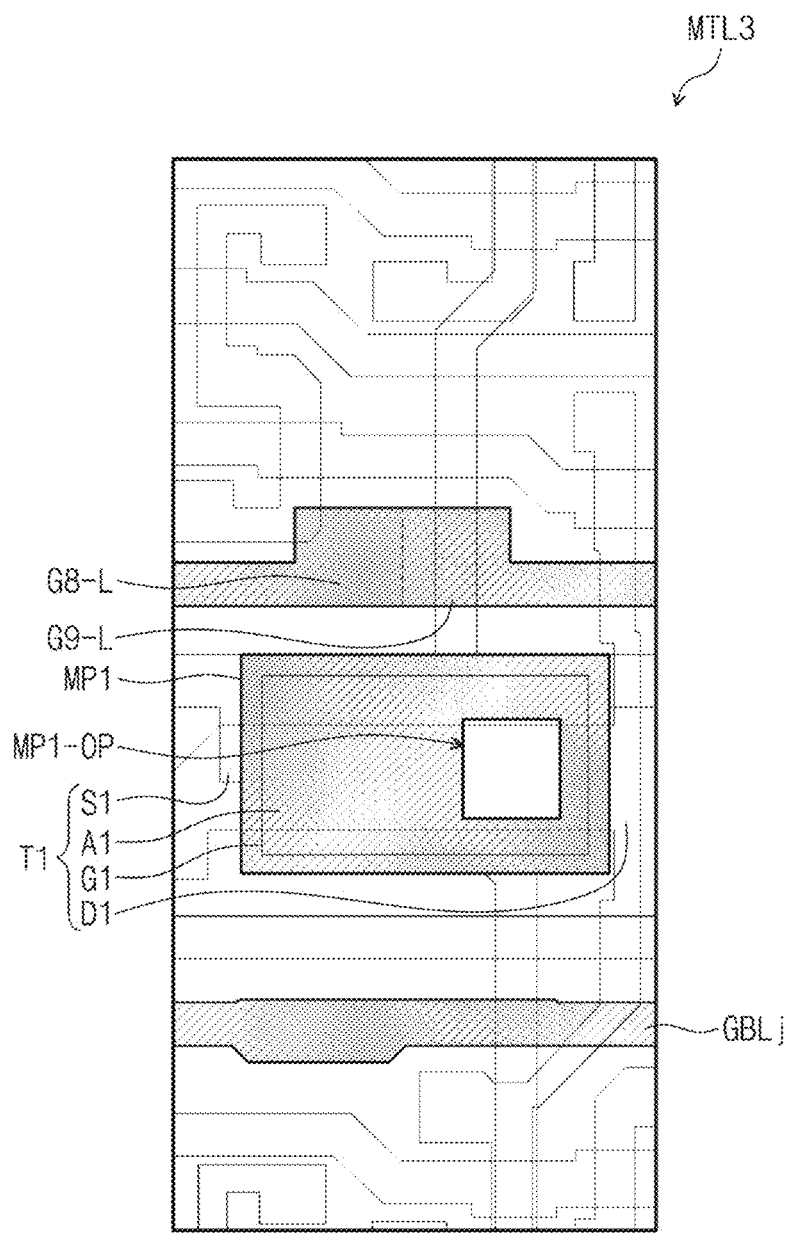

Referring to FIGS. 6 and 7D, conductive patterns of a third conductive layer MTL3 are disposed on the second insulating layer 20 (see FIG. 5). The conductive patterns of the third conductive layer MTL3 may include lower gate electrodes G8-L and G9-L of the eighth and ninth transistors T8 and T9. The conductive patterns of the third conductive layer MTL3 may include the first conductive pattern MP1 and the scan line GBLj. The gate electrode G1 of the first transistor T1 defines the first electrode E1-1 of the first capacitor Cst. The first conductive pattern MP1 defines the second electrode E1-2 of the first capacitor Cst and the first electrode E2-1 of the second capacitor Chold.

Figure 7E:
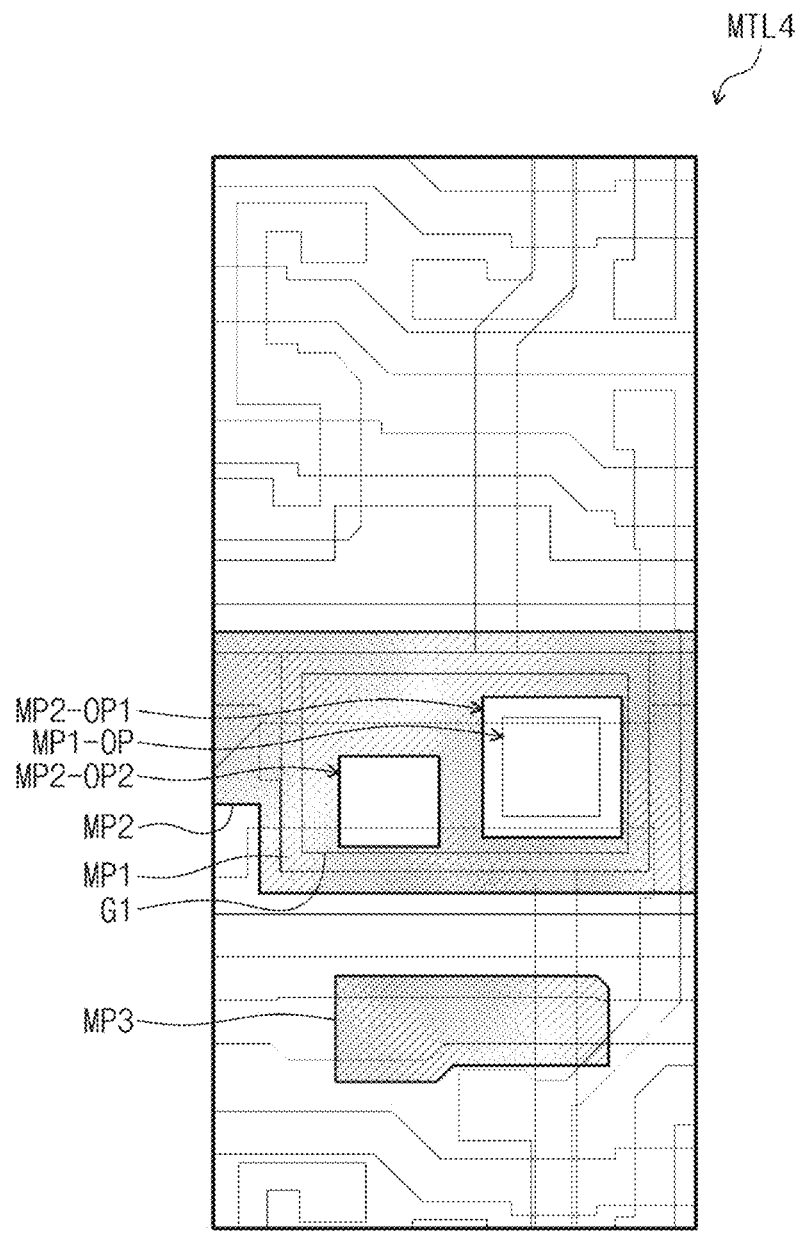

Referring to FIGS. 6 and 7E, a fourth conductive layer MTL4 is disposed on the third insulating layer 30 (refer to FIG. 5). The fourth conductive layer MTL4 may include the second conductive pattern MP2 and the third conductive pattern MP3.

The second conductive pattern MP2 defines the second electrode E2-2 of the second capacitor Chold shown in FIG. 2.

The third conductive pattern MP3 defines the first electrode E3-1 of the third capacitor Cb. A part of the scan line GBLj defines the second electrode E3-2 of the third capacitor Cb.

In such an embodiment, capacitance of each of the first capacitor Cst and the second capacitor Chold may be sufficiently secured, and pixel density may be increased, by forming the gate electrode G1 of the first transistor T1, the second conductive pattern MP2, and the third conductive pattern MP3 to overlap one another.

In an embodiment, when viewed on a plan view, the opening MP2-OP2 of the second conductive pattern MP2 overlaps the opening MP1-OP of the first conductive pattern MP1. In an embodiment, an area or size of the opening MP2-OP2 of the second conductive pattern MP2 may be greater than an area or size of the opening MP1-OP of the first conductive pattern MP1.

Figure 7F:
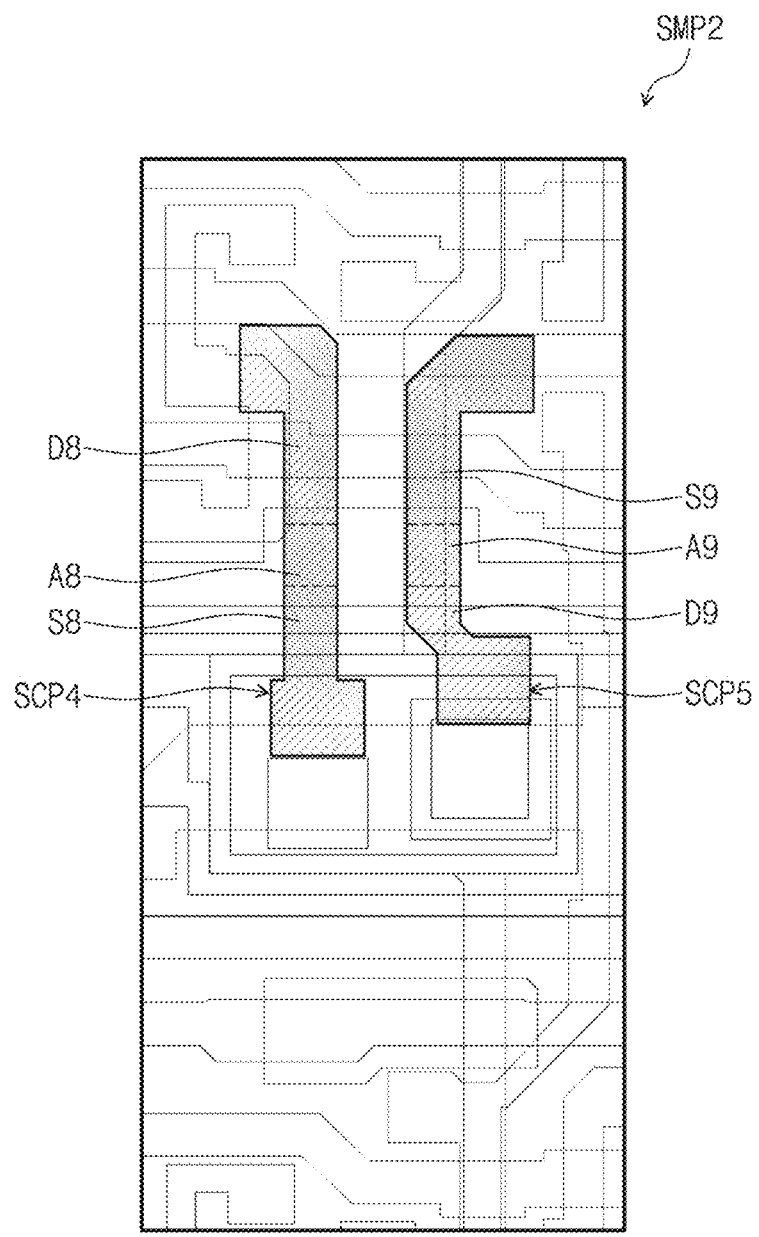

Referring to FIGS. 6 and 7F, semiconductor patterns of the second semiconductor layer SMP2 are disposed on the fourth insulating layer 40 (refer to FIG. 5). The semiconductor patterns may include a fourth semiconductor pattern SCP4 and a fifth semiconductor pattern SCP5.

The fourth semiconductor pattern SCP4 may include the first electrode D8, the semiconductor area A8, and the second electrode S8 of the eighth transistor T8. The fifth semiconductor pattern SCP5 may include a first electrode D9, a semiconductor area A9, and a second electrode S9 of the ninth transistor T9.

The first electrode/second electrode/semiconductor area in the fourth and fifth semiconductor patterns SCP4 and SCP5 shown in FIG. 7F are integrally formed with each other. After a reduction process is performed by using the gate electrodes G8 and G9 described with reference to FIG. 7G as a mask, the first electrode/second electrode is distinguished from the semiconductor area.

Figure 7G:
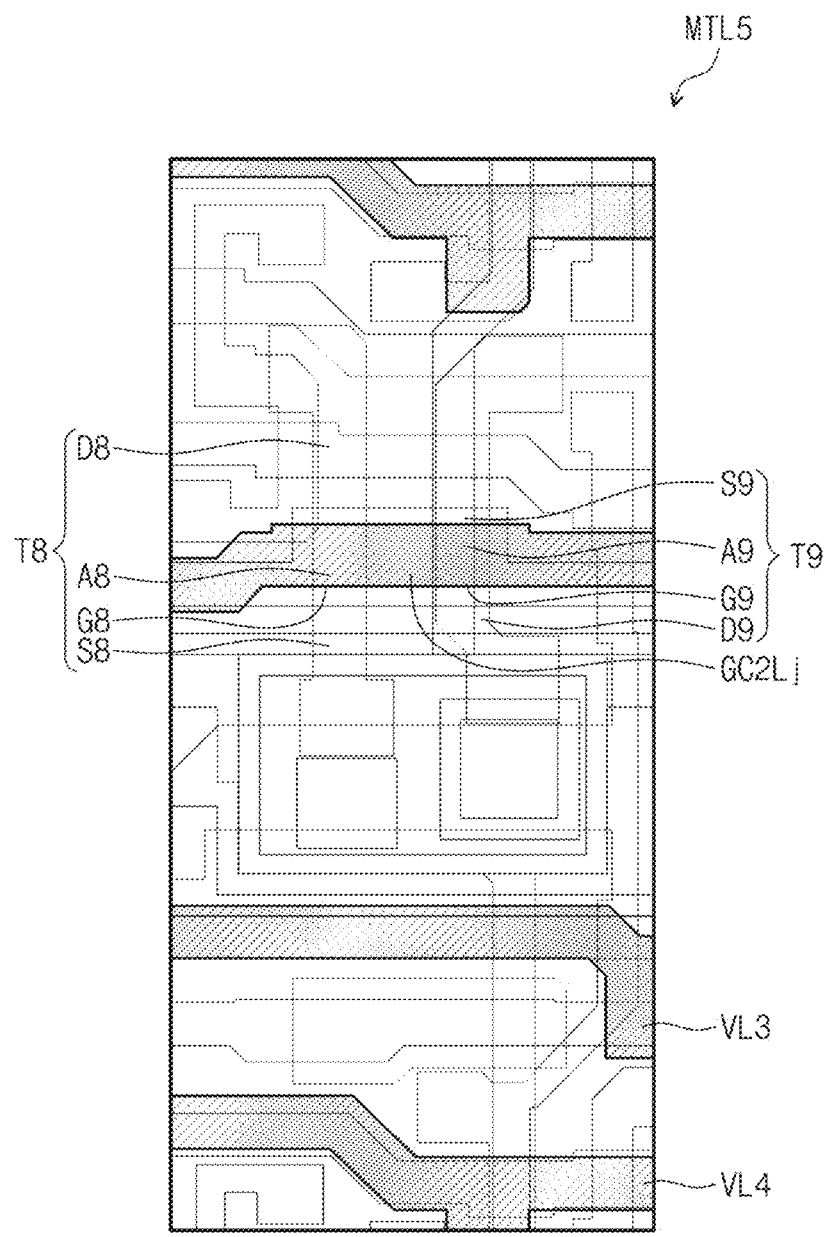

Referring to FIGS. 6 and 7G, conductive patterns of a fifth conductive layer MTL5 are disposed on the fifth insulating layer 50 (see FIG. 5). The conductive patterns of the fifth conductive layer MTL5 may include the scan line GC2Lj, the third voltage line VL3, and the fourth voltage line VL4.

A part of the scan line GC2Lj corresponds to the gate electrodes G8 and G9 of the eighth and ninth transistors T8 and T9. When a reduction process is performed by using the gate electrodes (G8, G9) as a mask, the first and second electrodes of each of the fourth and fifth semiconductor patterns (SCP4, SCP5) have greater conductivity than the semiconductor area of each of the fourth and fifth semiconductor patterns (SCP4, SCP5). After the reduction process is preformed, the eighth and ninth transistors T8 and T9 having a switch function are provided.

Figure 7H:
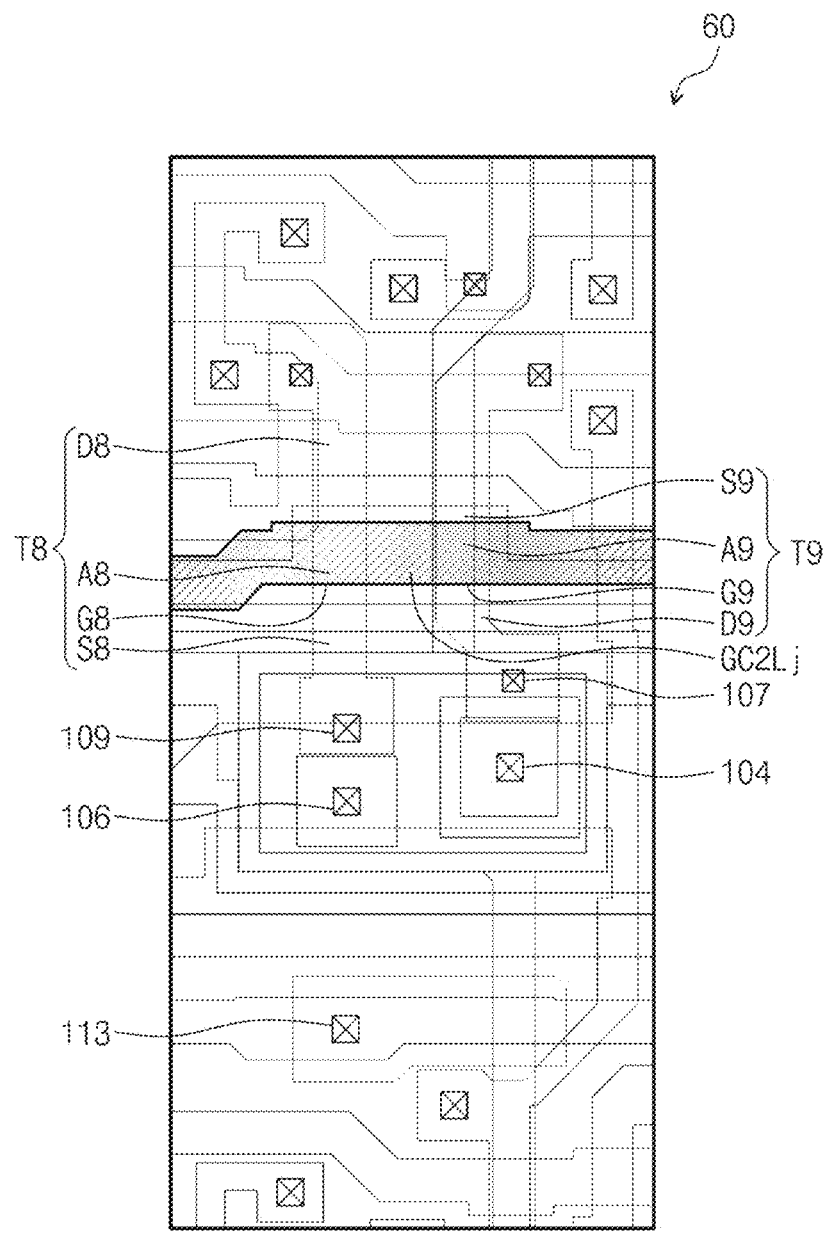

Referring to FIGS. 6 and 7H, the sixth insulating layer 60 is disposed on the fifth insulating layer 50 (refer to FIG. 5). FIG. 7H illustrates a plurality of contact holes 107 and 109 to 113 defined in the sixth insulating layer 60. Some of the plurality of contact holes 107, 109, 110 to 113 may be defined through the fifth insulating layer 50 and the sixth insulating layer 60, and the others thereof may be defined through the fourth to sixth insulating layers 40 to 60. The conductive patterns described with reference to FIGS. 7A to 7G and the conductive patterns shown in FIG. 7I to be described later are electrically connected through the contact holes 107, 109, and 110 to 113 to constitute the equivalent circuit of FIG. 2.

Figure 7I:
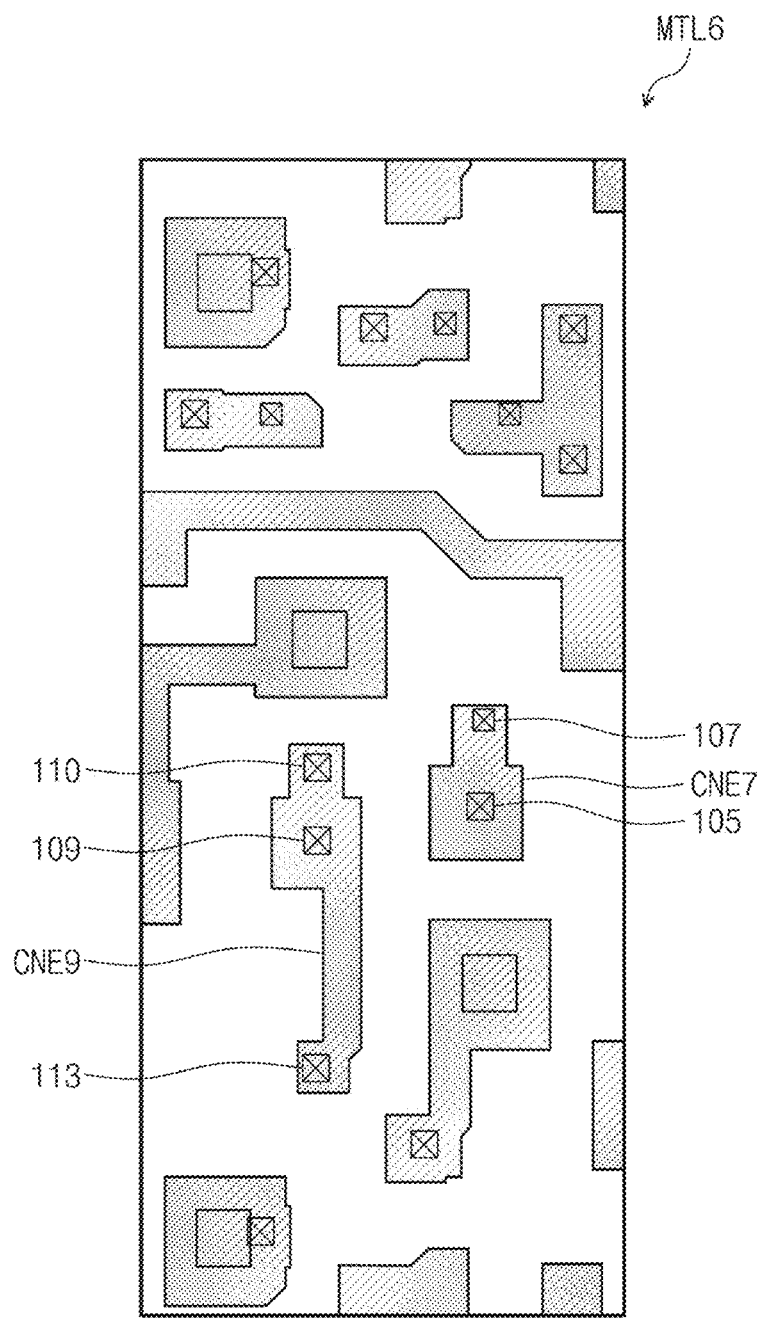

Referring to FIGS. 6 and 7I, conductive patterns of the sixth conductive layer MP6 are disposed on the sixth insulating layer 60 (refer to FIG. 5). The sixth conductive layer MP6 may include the second connection electrode CNE2, the seventh connection electrode CNE7, and the ninth connection electrode CNE9.

The second connection electrode CNE2 is connected to the second electrode D6 of the sixth transistor T6 shown in FIG. 7C through the contact hole 102.

The seventh connection electrode CNE7 may be connected to the second conductive pattern MP2 shown in FIG. 7E through the contact hole 107. The seventh connection electrode CNE7 may be connected to the second electrode S8 of the eighth transistor T8 shown in FIG. 7F through the contact hole 112. In addition, the seventh connection electrode CNE7 may be connected to the third conductive pattern MP3 shown in FIG. 7F through the contact hole 113.

The ninth connection electrode CNE9 is connected to the fourth connection electrode CNE4 shown in FIG. 5 through the contact hole 109. Furthermore, the ninth connection electrode CNE9 is connected to the second electrode S9 of the ninth transistor T9 shown in FIG. 7F through the contact hole 110.

Figure 7J:
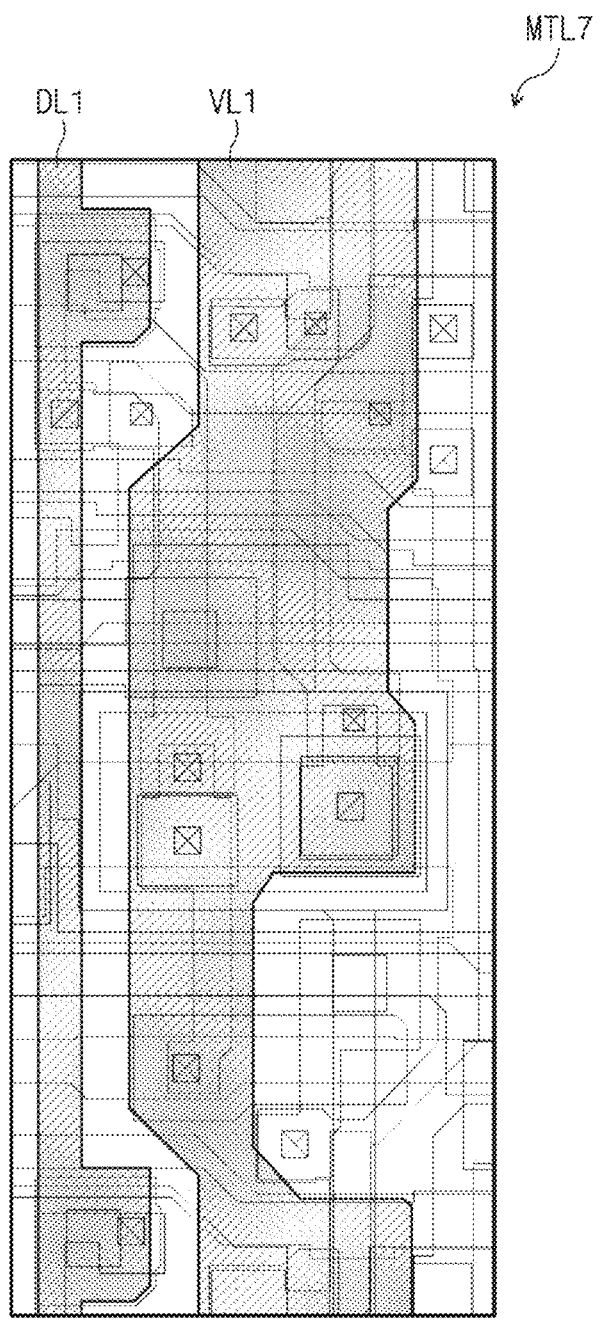

Referring to FIGS. 6 and 7J, conductive patterns of a seventh conductive layer MP7 are disposed on the seventh insulating layer 70 (see FIG. 4). The seventh conductive layer MP7 may include the data line DLi and the first voltage line VL1.

Figure 8:
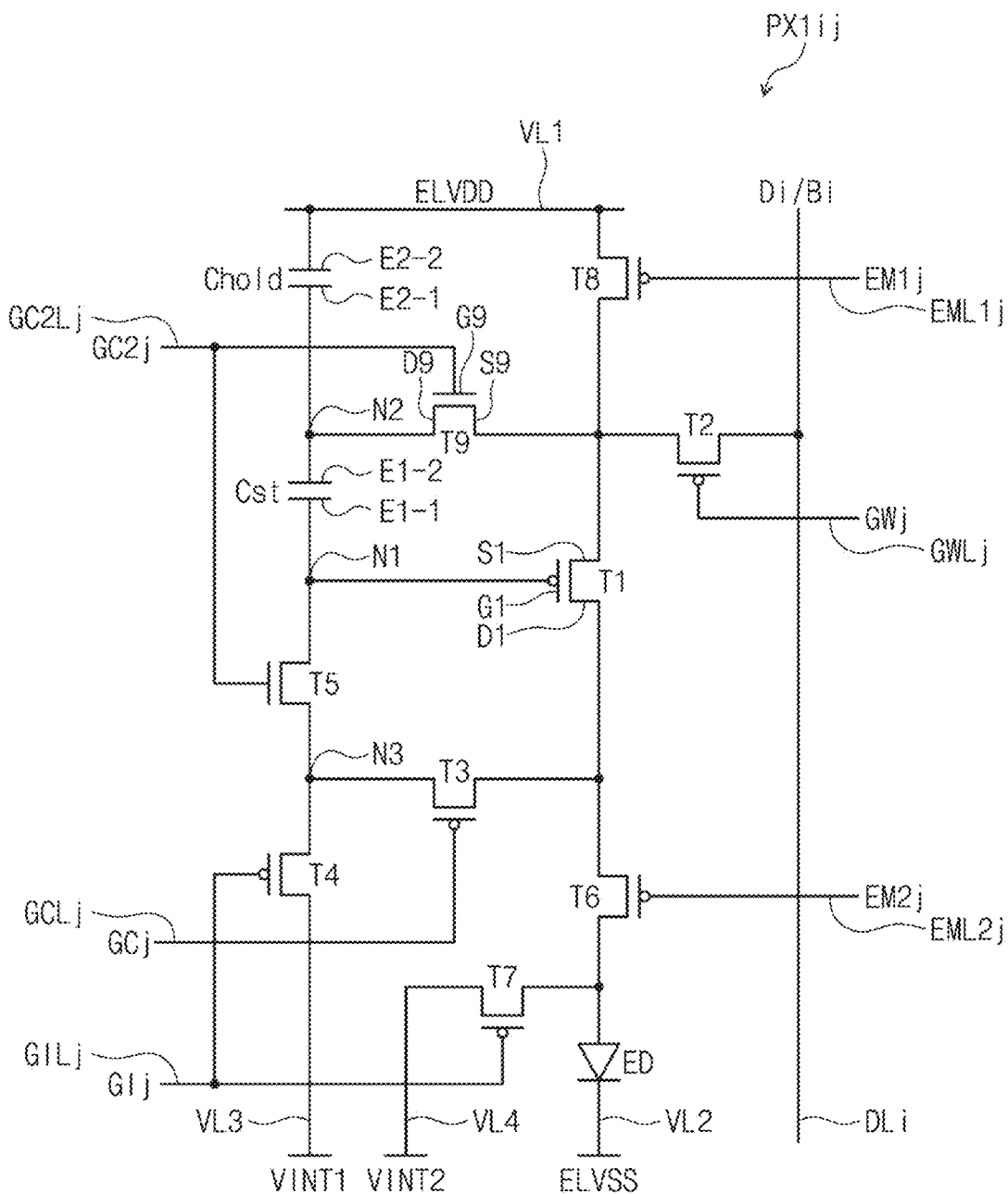
FIG. 8 is an equivalent circuit diagram of a pixel, according to an alternative embodiment of the disclosure.

FIG. 8 is an equivalent circuit diagram of a pixel, according to an alternative embodiment of the disclosure.

FIG. 8 illustrates a circuit diagram of a pixel PX1$ij$ connected to the i-th data line DLi among the data lines DL1 to DLm, the j-th scan lines GILj, GCLj, GWLj, and GC2Lj among the scan lines GIL1 to GILn, GCL1 to GCLn, GWL1 to GWLn, and GC2L1 to GC2Ln, and j-th emission control lines EML1$j$ and EML2$j$ among emission control lines EML11 to EML1$n$ and EML21 to EML2$n$.

Referring to FIG. 8, an embodiment of the pixel PX1$ij$ of a display device includes at least one light emitting element ED and a pixel circuit. The pixel circuit may include the first to ninth transistors T1, T2, T3, T4, T5, T6, T7, T8, and T9, the first capacitor Cst, and the second capacitor Chold. In an embodiment, the light emitting element ED may be a light emitting diode.

In an embodiment, some of the first to ninth transistors T1 to T9 are P-type transistors having LTPS as a semiconductor layer. The other(s) thereof may be an N-type transistor having an oxide semiconductor as a semiconductor layer.

In an embodiment, each of the first to fourth and sixth to eighth transistors T1 to T4 and T6 to T8 is a P-type transistor, and the fifth transistor T5 and the ninth transistor T9 are N-type transistors.

Embodiments of a circuit configuration of the pixel PX1$ij$ according to the disclosure are not limited to an embodiment in FIG. 8. The pixel PX1$ij$ illustrated in FIG. 8 is only an example, and the circuit configuration of the pixel PX1$ij$ may be variously modified and implemented.

The scan lines GILj, GCLj, GWLj, and GC2Lj may deliver the scan signals GIj, GCj, GWj, and GC2$j$, respectively. The emission control lines EML1$j$ and EML2$j$ may deliver the emission control signals EM1$j$ and EM2$j$, respectively. The data line DLi transmits one of the data signal Di and a bias signal Bi. The data signal Di may have a voltage level corresponding to the input image signal RGB that is input to the display device DD (see FIG. 1). The first to fourth voltage lines VL1, VL2, VL3, and VL4 may deliver the first driving voltage ELVDD, the second driving voltage ELVSS, the first initialization voltage VINT1, and the second initialization voltage VINT2, respectively. The third voltage line VL3 and the fourth voltage line VL4 may be referred to as a "first initialization voltage line" and a "second initialization voltage line", respectively.

The first transistor T1 includes a first electrode electrically connected to the first voltage line VL1 via the eighth transistor T8, a second electrode electrically connected to an anode of the light emitting element ED via the sixth transistor T6, and a gate electrode connected to the first node N1.

The second transistor T2 includes a first electrode connected to the data line DLi, a second electrode connected to the first electrode of the first transistor T1, and a gate electrode connected to the scan line GWLj. The second transistor T2 may be turned on in response to the scan signal GWj received through the scan line GWLj to deliver one of the data signal Di from the data line DLi or the bias signal Bi to the first electrode of the first transistor T1.

The third transistor T3 includes a first electrode connected to the second electrode of the first transistor T1, a second electrode, and a gate electrode connected to the scan line GCLj.

The fourth transistor T4 includes a first electrode connected to a third node N3, a second electrode connected to the third voltage line VL3, through which the first initialization voltage VINT1 is delivered, and a gate electrode connected to the scan line GILj. The fourth transistor T4 is turned on in response to the scan signal GIj received through the scan line GILj to deliver the first initialization voltage VINT1 to the third node N3. The first initialization voltage VINT1 may be provided as a gate electrode of the first transistor T1 through the fifth transistor T5. The first initialization voltage VINT1 may be a voltage for initializing the gate electrode of the first transistor T1.

The fifth transistor T5 includes a first electrode connected to the first node N1, a second electrode connected to the third node N3, and a gate electrode connected to the scan line GC2Lj. The fifth transistor T5 is turned on in response to the scan signal GC2$j$ delivered through the scan line GC2Lj to electrically connect the third node N3 and the first node N1.

The sixth transistor T6 includes a first electrode connected to the second electrode of the first transistor T1, a second electrode connected to the anode of the light emitting element ED, and a gate electrode connected to the emission control line EML2$jb$. The sixth transistor T6 may be turned on in response to the emission control signal EM2$j$ received through the emission control line EML2$j$ to electrically connect the second electrode of the first transistor T1 to the light emitting element ED.

The seventh transistor T7 includes a first electrode connected to the anode of the light emitting element ED, a second electrode connected to the fourth voltage line VL4, and a gate electrode connected to the scan line GILj. The seventh transistor T7 may be turned on in response to the scan signal GIj received through the scan line GILj such that the fourth initialization voltage line VL4 is electrically connected to the anode of the light emitting element ED. Accordingly, the current of the anode of the light emitting element ED may be bypassed to the fourth voltage line VL4 through the seventh transistor T7.

The eighth fifth transistor T8 includes a first electrode connected to the first voltage line VL1, a second electrode connected to the first electrode of the first transistor T1, and a gate electrode connected to the emission control line EML1$j$. The eighth transistor T8 is turned on in response to the emission control signal EM1$j$ received through the emission control line EML1$j$ to deliver the first driving voltage ELVDD to the first electrode of the first transistor T1.

The ninth transistor T9 includes a first electrode connected to the first electrode of the first transistor T1, a second electrode connected to the second node N2, and a gate electrode connected to the scan line GC2Lj. The ninth transistor T9 is turned on in response to the scan signal GC2$j$ received through the scan line GC2Lj to electrically connect the first electrode of the first transistor T1 and the second node N2.

The first capacitor Cst includes the first electrode E1-1 connected to the first node N1 and the second electrode E1-2 connected to the second node N2.

The second capacitor Chold includes the first electrode E2-1 connected to the second node N2 and the second electrode E2-2 connected to the first voltage line VL1.

Figure 9:
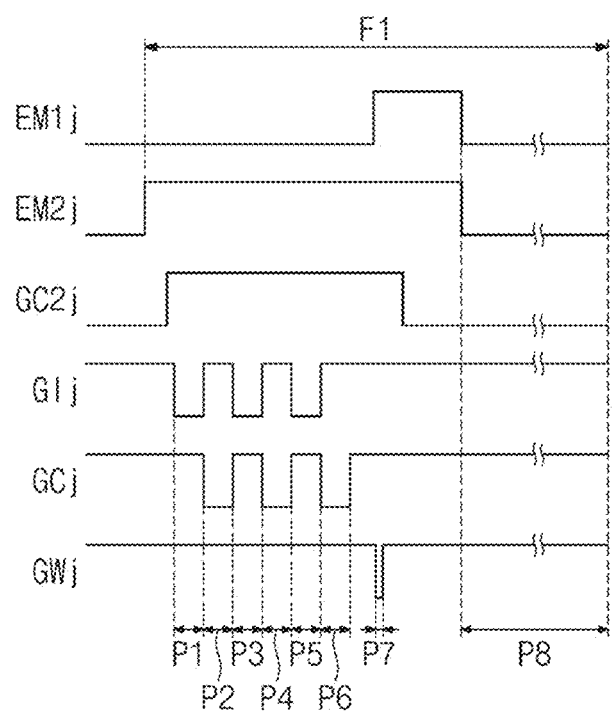
FIG. 9 is a timing diagram of scan signals and emission control signals for describing an operation of the pixel shown in FIG. 8.

FIG. 9 is a timing diagram of scan signals and emission control signals for describing an operation of the pixel shown in FIG. 8.

Referring to FIGS. 8 and 9, first to eighth periods P1 to P8 mean operating states or operating periods of the pixel PX1$ij$. When, during the first to sixth periods P1 to P6, the emission control signal EMU is at a low level and the scan signal GC2$j$ is at a high level, the fifth transistor T5, the eighth transistor T8, and the ninth transistor T9 are turned on.

When the scan signal GIj is at a low level in each of the first period P1, third period P3, and the fifth period P5, the fourth transistor T4 and the seventh transistor T7 are turned on. Accordingly, the first initialization voltage VINT1 may be delivered to the first node N1 (i.e., a gate electrode of the first transistor T1) through the fourth transistor T4 and the fifth transistor T5, and a current of the anode of the light emitting element ED may be discharged to the fourth voltage line VL4 through the seventh transistor T7.

The first period P1, the third period P3, and the third period P5 may be initialization periods for initializing the gate electrode of the first transistor T1 and the anode of the light emitting element ED.

When the scan signal GCj is at a low level during each of the second period P2, the fourth period P4, and the sixth period P6, the third transistor T3 is turned on. Accordingly, a voltage obtained by subtracting the first driving voltage ELVDD by a threshold voltage (referred to as "Vth") of the first transistor T1 may be provided to one end of the first capacitor Cst through the third transistor T3. At this time, because the ninth transistor T9 is turned on, the first driving voltage ELVDD is provided to the other end of the first capacitor Cst. Accordingly, a voltage difference between opposite ends of the first capacitor Cst is the same as the threshold voltage (Vth) of the first transistor T1.

Each of the second period P2, the fourth period P4, and the sixth period P6 may be a compensation period for compensating for the threshold voltage (Vth) of the first transistor T1.

The pixel PXij that alternately repeats the first period P1, the third period P3, and the fifth period P5 for initializing the gate electrode of the first transistor T1 and the anode of the light emitting element ED and the second period P2, the fourth period P4, and the sixth period P6 for compensating for the threshold voltage (Vth) of the first transistor T1 may sufficiently secure initialization and compensation time. Accordingly, the data signal Di in the previous frame may have a minimal effect on the current frame.

FIG. 9 shows that the pixel PX1ij alternately performs an initialization period and a compensation period three times in one frame, but the disclosure is not limited thereto. The number of times that the initialization period is repeated and the number of times that the compensation period is repeated may be variously changed.

When initialization and compensation operations are completed (i.e., when the sixth period P6 ends), the emission control signal EM1j transitions to a high level.

When the scan signal GWj transitions to a low level during the seventh period P7, the second transistor T2 is turned on. A voltage level (referred to as "Vdata" described below) corresponding to the data signal Di of the data line DLi may be provided to the second node N2 through the second transistor T2 and the eighth transistor T9.

When a voltage level (Vdata) corresponding to the data signal Di is provided to the second node N2, that is, the first electrode E1-1 of the first capacitor Cst, the voltage level of the gate electrode of the first transistor T1 changes to (Vdata−Vth).

The seventh period P7 may be a write period for providing the voltage level (Vdata) corresponding to the data signal Di to the first electrode E1-1 of the first capacitor Cst.

When the seventh period P7 ends, the scan signal GC2j transitions from a high level to a low level. That is, during the first to seventh periods P1 to P7, the scan signal GC2j may be maintained at a high level.

When the emission control signals EM1j and EM2j transition to a low level during the eighth period P8, a current path may be formed from the first voltage line VL1 to the light emitting element ED through the eighth transistor T8, the first transistor T1, and the sixth transistor T6.

The current flowing through the light emitting element ED is proportional to (Vgs−Vth)$^2$ that is the square of a difference between a gate-source voltage (referred to as "Vgs") of the first transistor T1 and the threshold voltage Vth of the first transistor T1. Because the voltage level of the gate electrode of the first transistor T1 is (Vdata−Vth), the current flowing through the light emitting element ED is proportional to (ELVDD−Vdata)$^2$ that is the square of a difference between the first driving voltage ELVDD and the voltage level (Vdata) corresponding to the data signal Di. Accordingly, the threshold voltage (Vth) of the first transistor T1 may not affect a current flowing through the light emitting element ED. The eighth period P8 may be an emission period of the light emitting element ED.

Because the scan signal GC2j is at a low level during the eighth period P8 that is the emission period, the fifth transistor T5 and the ninth transistor T9 are turned off. In an embodiment, the fifth transistor T5 and the ninth transistor T9 are N-type transistors, and thus a leakage current may be minimized compared to a P-type transistor. Accordingly, a voltage between opposite ends of the first capacitor Cst may be maintained uniformly during the emission period.

Figure 10:
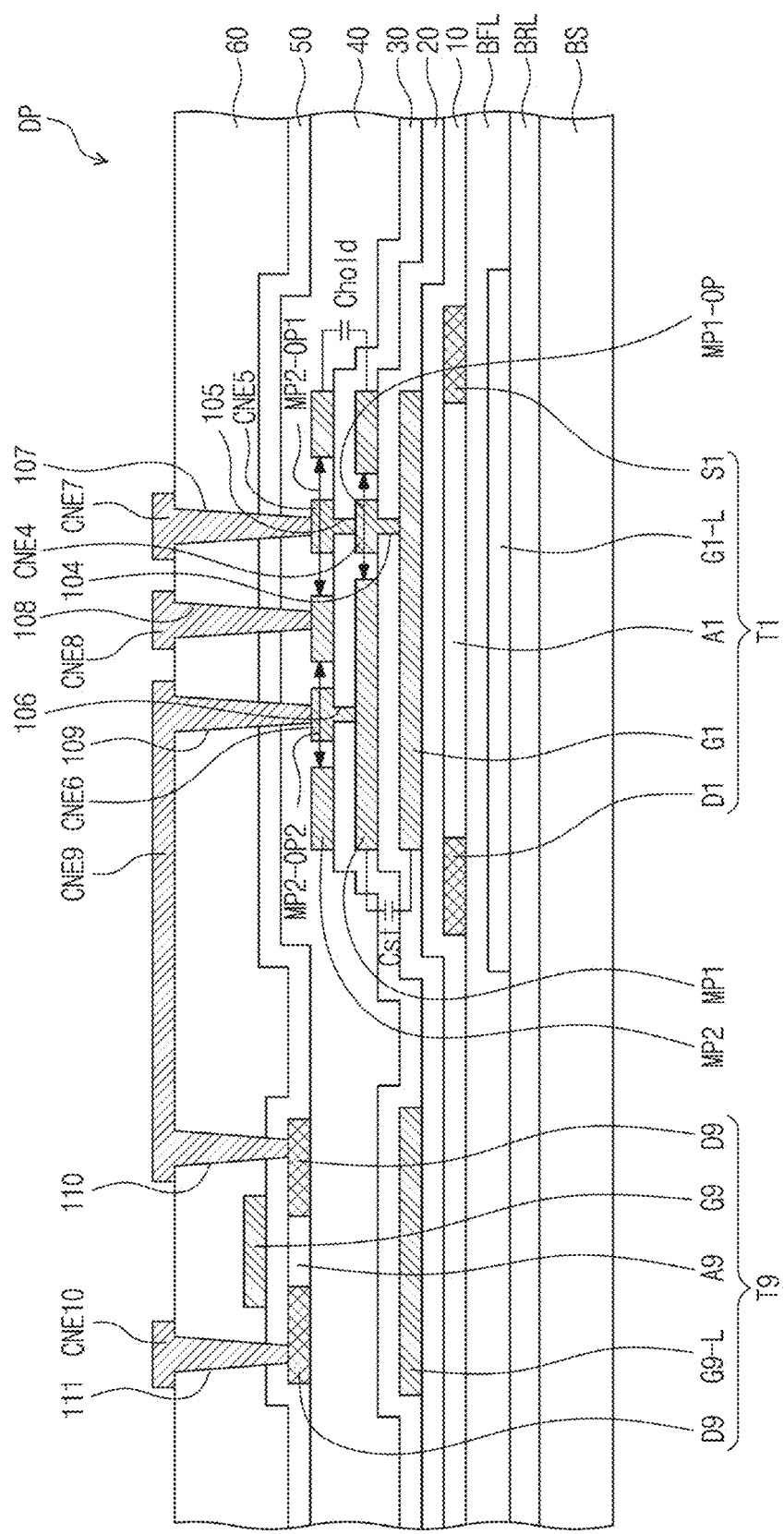
FIG. 10 shows a cross-section of a first transistor, a ninth transistor, a first capacitor, and a second capacitor of a pixel shown in FIG. 8.

FIG. 10 shows a cross-section of the first transistor T1, the ninth transistor T9, the first capacitor Cst, and the second capacitor Chold of the pixel PX1ij shown in FIG. 8.

A cross-section of the first transistor T1, the first capacitor Cst, and the second capacitor Chold of the pixel PX1ij shown in FIG. 10 is similar to a cross-section of the first transistor T1, the first capacitor Cst, and the second capacitor Chold of the pixel PXij shown in FIG. 5, and thus, any repetitive detailed description of the same or like elements as those described above with reference to FIG. 5 will be omitted or simplified to avoid redundancy.

In an embodiment, as illustrated in FIG. 10, a conductive layer (hereinafter, referred to as a "third conductive layer") is disposed on the second insulating layer 20. The third conductive layer may include a plurality of conductive patterns. In an embodiment, the third conductive layer may include a lower gate electrode G9-L and a first conductive pattern MP1 of the ninth transistor T9. The lower gate electrode G9-L is spaced from the first conductive pattern MP1. In a cross-sectional view, the first conductive pattern MP1 overlaps the gate electrode G1 of the first transistor T1.

A semiconductor layer is disposed on the fourth insulating layer 40. The semiconductor layer may include a plurality of semiconductor patterns. The semiconductor pattern may include metal oxide. The first electrode D9, a semiconductor area A9, and the second electrode S9 of the ninth transistor T9 are formed from or defined by the semiconductor patterns. The first electrode D9 and the second electrode S9 of the ninth transistor T9 extend in opposite directions from the semiconductor area A9.

The lower gate electrode G9-L has a function of a light blocking pattern. The lower gate electrode G9-L is disposed under the semiconductor area A9 of the ninth transistor T9 to block light incident from the outside. The light blocking pattern prevents external light from changing voltage-current characteristics of the ninth transistor T9.

The fifth insulating layer 50 covering the semiconductor pattern is disposed on the fourth insulating layer 40.

Another conductive layer (hereinafter, referred to as a "fifth conductive layer") is disposed on the fifth conductive layer 50. The fifth conductive layer may include a plurality of conductive patterns. In an embodiment, the fifth conductive layer may include the gate electrode G9 of the ninth transistor T9.

The sixth insulating layer 60 covering the gate electrode G9 of the ninth transistor T9 is disposed on the fifth insulating layer 50.

Another conductive layer (hereinafter, referred to as a "sixth conductive layer") is disposed on the sixth insulating layer 60. The sixth conductive layer may include a plurality of connection electrodes. FIG. 10 shows the seventh to tenth connection electrodes CNE5 to CNE10.

The ninth connection electrode CNE9 is connected to the sixth connection electrode CNE6 through the contact hole 109 defined through the fourth to sixth insulating layers 40 to 60. In addition, the ninth connection electrode CNE9 is connected to the second electrode S9 of the ninth transistor T9 through a contact hole 110 defined through the fifth and sixth insulating layers 50 and 60. The ninth connection electrode CNE9 may be the second node N2 illustrated in FIG. 8.

The tenth connection electrode CNE10 is connected to the first electrode D9 of the ninth transistor T9 through a contact hole 111 defined through the fifth to sixth insulating layers 50 and 60.

Figure 11A:
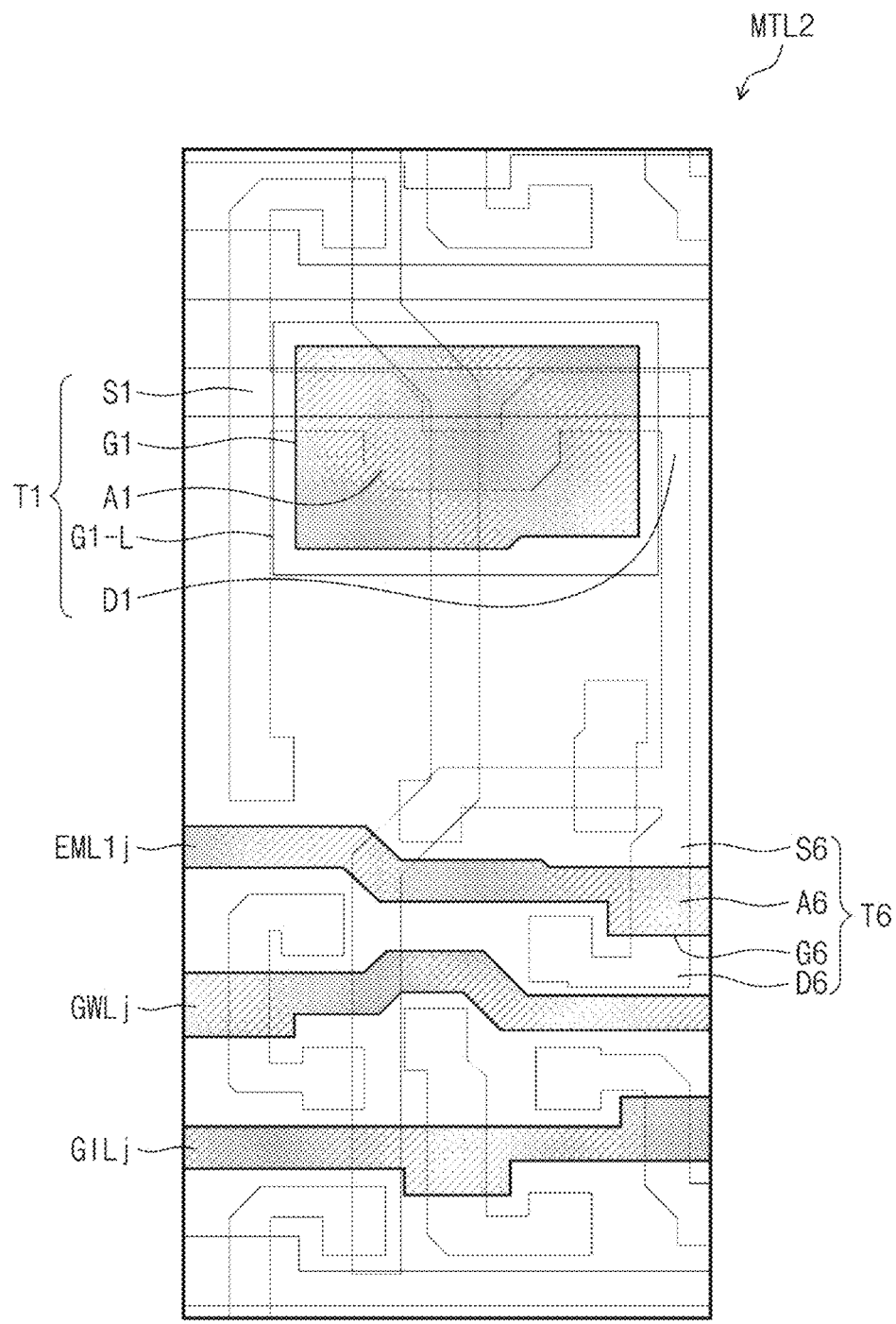
FIGS. 11A to 11C are plan views of patterns in a partial area of the pixel PXij, which are sequentially disposed one on another, according to an embodiment of the disclosure.
Figure 11B:
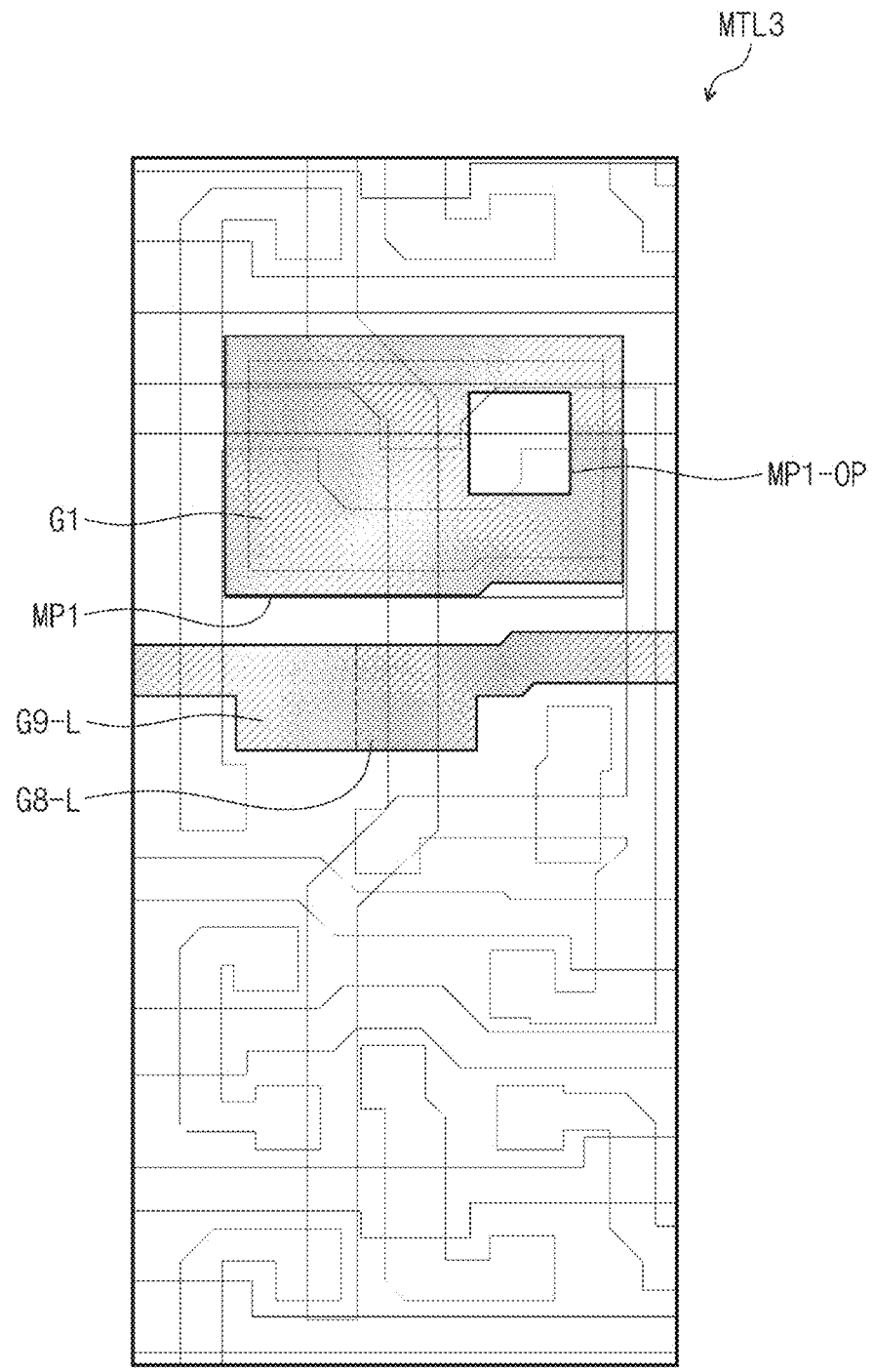
Figure 11C:
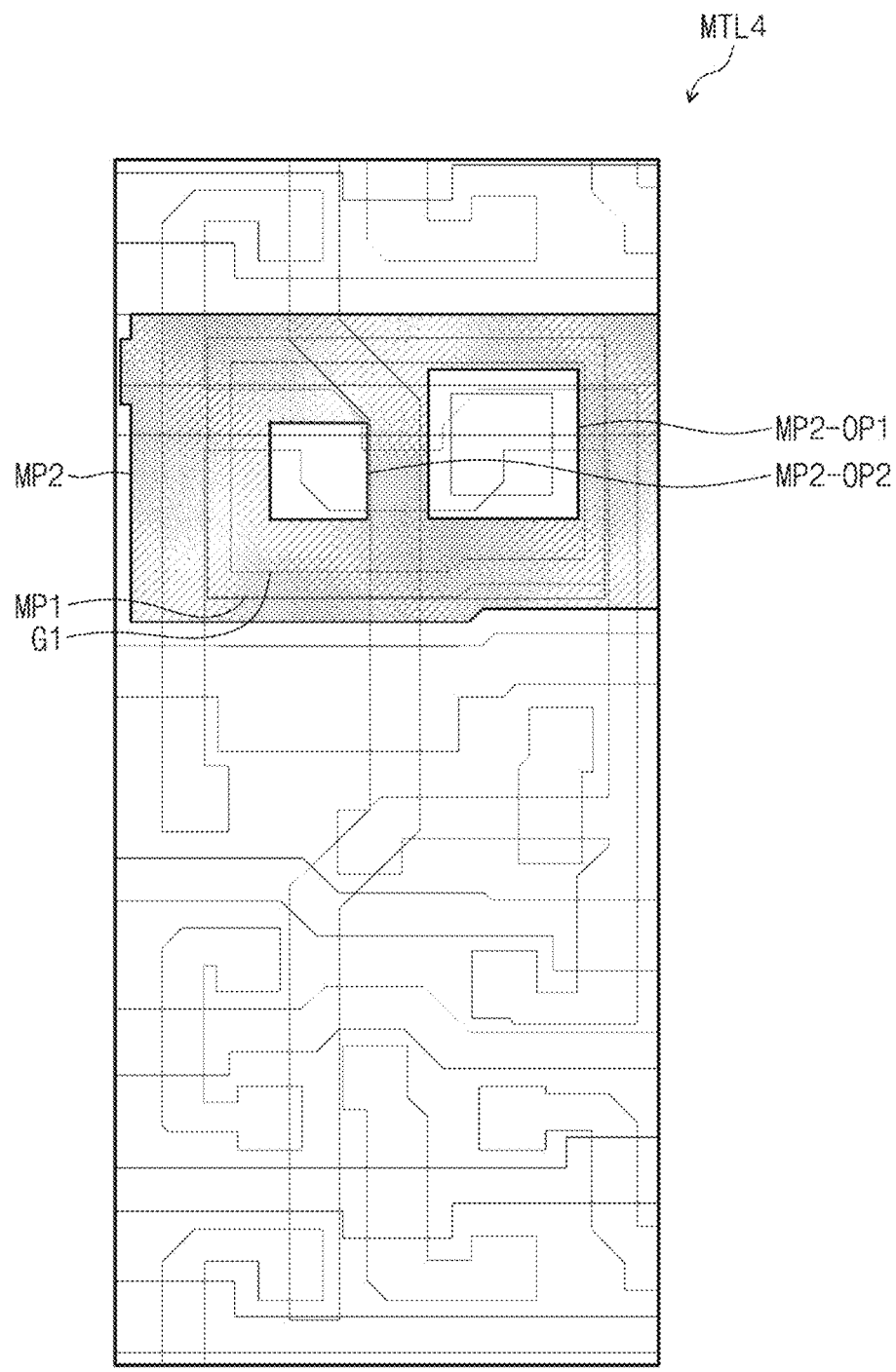

FIGS. 11A to 11C are plan views patterns in a partial area of the pixel PXij, which are sequentially disposed one on another, according to an embodiment of the disclosure. Hereinafter, any repetitive detailed description of the same or like elements as those described with reference to FIGS. 1 to 10 will be omitted or simplified to avoid redundancy.

Referring to FIG. 11A, conductive patterns of the second conductive layer MTL2 are disposed on the first insulating layer 10 (see FIG. 5). The conductive patterns of the second conductive layer MTL2 may include the gate electrode G1 of the first transistor T1 and the emission control line EML1j. A part of the emission control line EML1j corresponds to the gate electrode G6 of the sixth transistor T6.

Referring to FIG. 11B, conductive patterns of the third conductive layer MTL3 are disposed on the second insulating layer 20 (see FIG. 5). The conductive patterns of the third conductive layer MTL3 may include lower gate electrodes G8-L and G9-L of the eighth and ninth transistors T8 and T9. The conductive patterns of the third conductive layer MTL3 may include the first conductive pattern MP1. The gate electrode G1 of the first transistor T1 defines the first electrode E1-1 of the first capacitor Cst. The first conductive pattern MP1 defines the second electrode E1-2 of the first capacitor Cst and the first electrode E2-1 of the second capacitor Chold.

Referring to FIG. 11C, the fourth conductive layer MTL4 is disposed on the third insulating layer 30 (refer to FIG. 5). Conductive patterns of the fourth conductive layer MTL4 may include the second conductive pattern MP2.

The second conductive pattern MP2 defines the second electrode E2-2 of the second capacitor Chold shown in FIG. 8.

In such an embodiment, capacitance of each of the first capacitor Cst and the second capacitor Chold may be sufficiently secured, and pixel density may be increased, by forming the gate electrode G1 of the first transistor T1, the second conductive pattern MP2, and the third conductive pattern MP3 to overlap one another.

Figure 12:
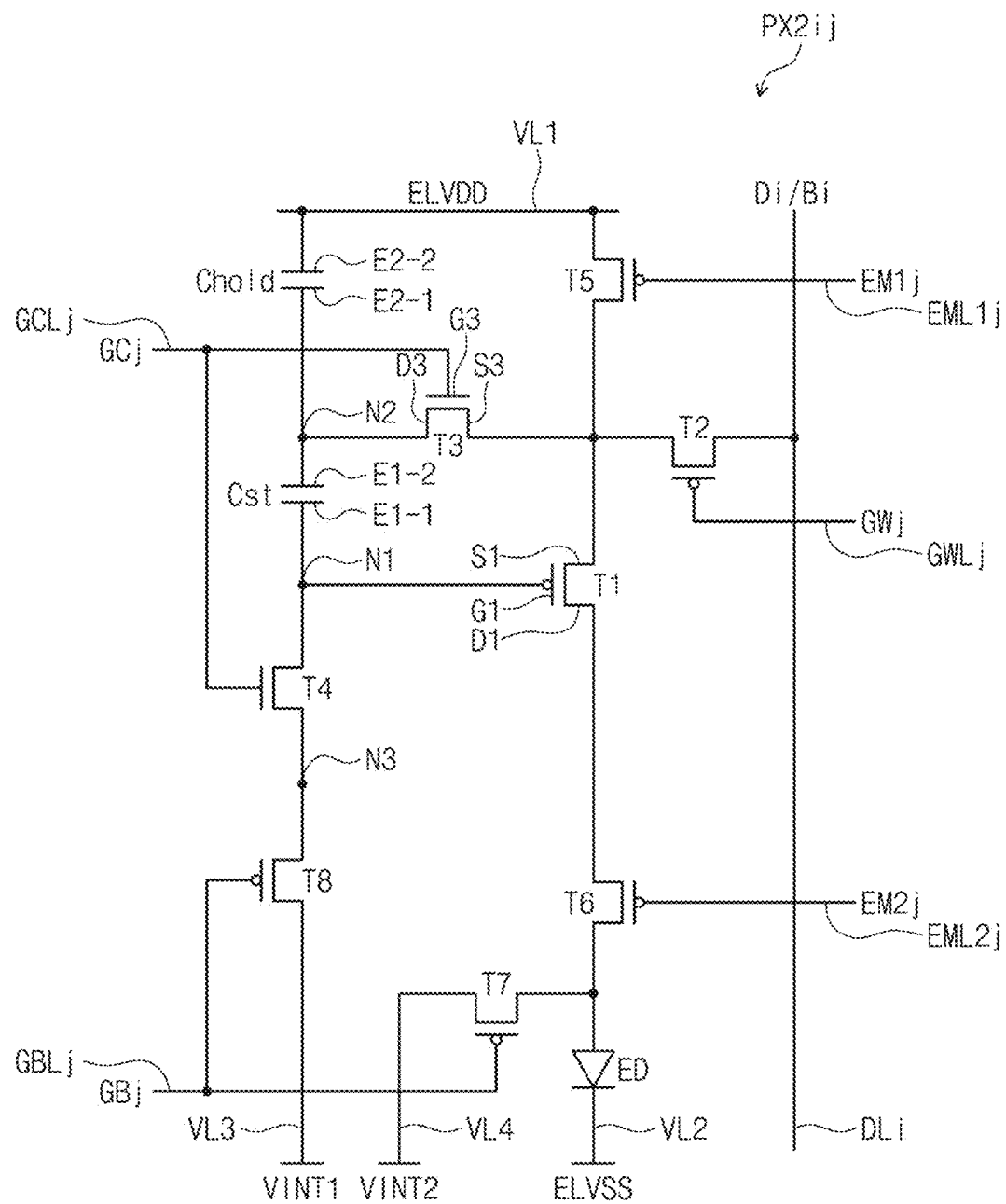
FIG. 12 is an equivalent circuit diagram of a pixel, according to an alternative embodiment of the disclosure.

FIG. 12 is an equivalent circuit diagram of a pixel, according to an alternative embodiment of the disclosure.

FIG. 12 illustrates a circuit diagram of a pixel PX2ij connected to the i-th data line DLi among the data lines DL1 to DLm, the j-th scan lines GBLj, GCLj, and GWLj among the scan lines GBL1 to GBLn, GCL1 to GCLn, and GWL1 to GWLn, and the j-th emission control lines EML1j and EML2j among emission control lines EML11 to EML1n and EML21 to EML2n.

Referring to FIG. 12, an embodiment of the pixel PX2ij of a display device includes at least one light emitting element ED and a pixel circuit. The pixel circuit may include the first to eighth transistors T1, T2, T3, T4, T5, T6, T7, and T8, the first capacitor Cst, and the second capacitor Chold. In an embodiment, the light emitting element ED may be a light emitting diode.

In an embodiment, some of the first to eighth transistors T1 to T8 are P-type transistors having LTPS as a semiconductor layer. The other(s) thereof may be an N-type transistor having an oxide semiconductor as a semiconductor layer.

In an embodiment, each of the first, second, and fifth to eighth transistors T1, T2, and T5 to T8 is a P-type transistor, and the third transistor T3 and the fourth transistor T4 are N-type transistors.

Figure 13:
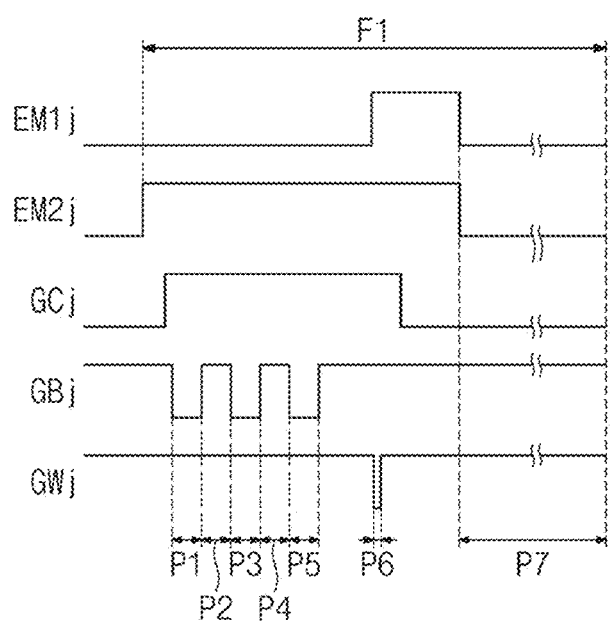
FIG. 13 is a timing diagram of scan signals and emission control signals for describing an operation of the pixel shown in FIG. 12.

Embodiments of a circuit configuration of the pixel PX2ij are not limited to an embodiment in FIG. 12. The pixel PX2ij illustrated in FIG. 13 is only an example, and the circuit configuration of the pixel PX2ij may be variously modified and implemented.

The scan lines GBLj, GCLj, and GWLj may deliver the scan signals GBj, GCj, and GWj, respectively. The emission control lines EML1j and EML2j may deliver the emission control signals EMU and EM2j, respectively. The data line DLi transmits one of the data signal Di and the bias signal Bi. The data signal Di may have a voltage level corresponding to the input image signal RGB that is input to the display device DD (see FIG. 1). The first to fourth voltage lines VL1, VL2, VL3, and VL4 may deliver the first driving voltage ELVDD, the second driving voltage ELVSS, the first initialization voltage VINT', and the second initialization voltage VINT2, respectively. The third voltage line VL3 and the fourth voltage line VL4 may be referred to as a "first initialization voltage line" and a "second initialization voltage line", respectively.

The first transistor T1 includes a first electrode electrically connected to the first voltage line VL1 via the fifth transistor T5, a second electrode electrically connected to an anode of the light emitting element ED via the sixth transistor T6, and a gate electrode connected to the first node N1.

The second transistor T2 includes a first electrode connected to the data line DLi, a second electrode connected to the first electrode of the first transistor T1, and a gate electrode connected to the scan line GWLj. The second transistor T2 may be turned on in response to the scan signal GWj received through the scan line GWLj to deliver one of the data signal Di from the data line DLi or the bias signal Bi to the first electrode of the first transistor T1.

The third transistor T3 includes a first electrode connected to the first electrode of the first transistor T1, a second electrode connected to the second node N2, and a gate electrode connected to the scan line GCLj. The third transistor T3 may be turned on in response to the scan signal GCj through the scan line GCLj to electrically connect the first electrode of the first transistor T1 and the second node N2.

The fourth transistor T4 includes a first electrode connected to the first node N1, a second electrode connected to the third node N3, and a gate electrode connected to the scan line GCLj. The fourth transistor T4 may be turned on in response to the scan signal GCj delivered through the scan line GCLj to electrically connect the third node N3 and the first node N1.

The fifth transistor T5 includes a first electrode connected to the first voltage line VL1, a second electrode connected to the first electrode of the first transistor T1, and a gate electrode connected to the emission control line EML1j. The fifth transistor T5 is turned on in response to the emission control signal EM1j received through the emission control line EML1j to deliver the first driving voltage ELVDD to the first electrode of the first transistor T1.

The sixth transistor T6 includes a first electrode connected to the second electrode of the first transistor T1, a second electrode connected to the anode of the light emitting element ED, and a gate electrode connected to the emission control line EML2j. The sixth transistor T6 may be turned on in response to the emission control signal EM2j received through the emission control line EML2j to electrically connect the second electrode of the first transistor T1 to the light emitting element ED.

The seventh transistor T7 includes a first electrode connected to the anode of the light emitting element ED, a second electrode connected to the fourth voltage line VL4, and a gate electrode connected to the scan line GBLj. The seventh transistor T7 may be turned on in response to the scan signal GBj received through the scan line GBLj such that the fourth initialization voltage line VL4 is electrically connected to the anode of the light emitting element ED. Accordingly, the current of the anode of the light emitting element ED may be bypassed to the fourth voltage line VL4 through the seventh transistor T7.

The eighth transistor T8 includes a first electrode connected to the third node N3, a second electrode connected to the third voltage line VL3, through which the first initialization voltage VINT1 is delivered, and a gate electrode connected to the scan line GBLj. The eighth transistor T8 is turned on in response to the scan signal GBj received through the scan line GBLj to deliver the first initialization voltage VINT1 to the third node N3. The first initialization voltage VINT1 may be a voltage for initializing the gate electrode of the first transistor T1.

The first capacitor Cst includes the first electrode E1-1 connected to the first node N1 and the second electrode E1-2 connected to the second node N2.

The second capacitor Chold includes the first electrode E2-1 connected to the second node N2 and the second electrode E2-2 connected to the first voltage line VL1.

FIG. 13 is a timing diagram of scan signals and emission control signals for describing an operation of the pixel shown in FIG. 12.

Referring to FIGS. 12 and 13, the first to seventh periods P1 to P7 mean operating states or operating periods of the pixel PX2ij. When, during the first to fifth periods P1 to P5, the emission control signal EMU is at a low level and the scan signal GCj is at a high level, the fifth transistor T5, the third transistor T3, and the ninth transistor T4 are turned on.

When the scan signal GBj is at a low level in each of the first period P1, third period P3, and the fifth period P5, the eighth transistor T8 and the seventh transistor T7 are turned on. Accordingly, the first initialization voltage VINT1 may be delivered to the first node N1 (i.e., a gate electrode of the first transistor T1) through the eighth transistor T8 and the fourth transistor T4. Moreover, a current of the anode of the light emitting element ED may be discharged to the fourth voltage line VL4 through the seventh transistor T7.

When the scan signal GBj is at a high level in each of the second period P2 and the fourth period P4, the eighth transistor T8 and the seventh transistor T7 are turned off. As the eighth transistor T8 is repeatedly turned on/off during the first to fifth periods P1 to P5, the initialization time of the first capacitor Cst may be sufficiently secured.

In the meantime, during the first to fifth periods P1 to P5, the emission control signal EMU is at a low level and the scan signal GCj is at a high level. Accordingly, the transistors T5 and T3 are turned on. Accordingly, the first driving voltage ELVDD may be provided to the first node N1.

When the scan signal GWj transitions to a low level during the sixth period P6, the second transistor T2 is turned on. A voltage corresponding to the data signal Di of the data line DLi may be provided to the second node N2 through the second transistor T2 and the third transistor T3. When the sixth period P6 ends, the scan signal GCj transitions from a high level to a low level.

When the emission control signals EMU and EM2j transition to a low level during the seventh period P7, a current path may be formed from the first voltage line VL1 to the light emitting element ED through the fifth transistor T5, the first transistor T1, and the sixth transistor T6.

Figure 14:
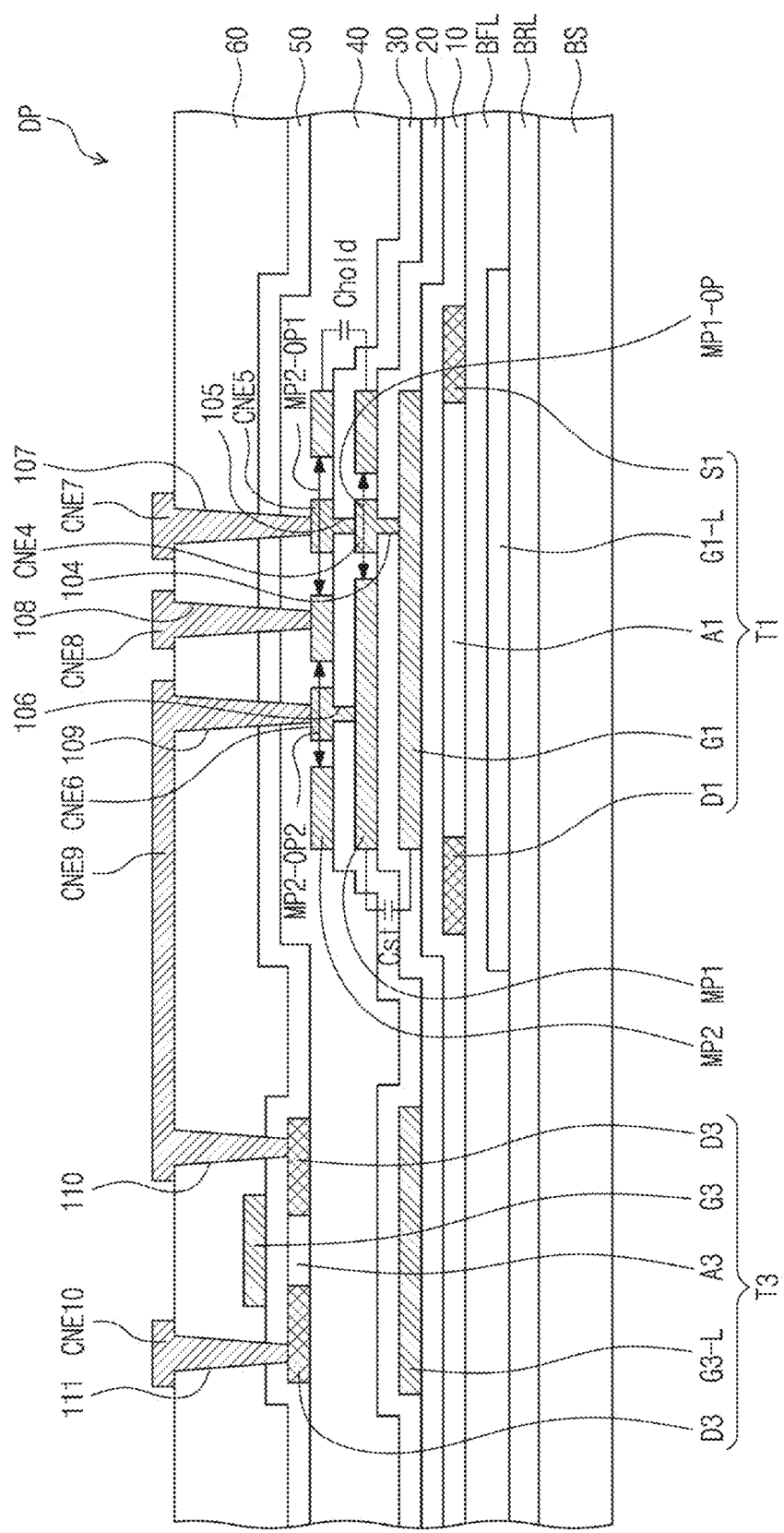
FIG. 14 shows a cross-section of a first transistor, a third transistor, a first capacitor, and a second capacitor of a pixel shown in FIG. 12.

FIG. 14 shows a cross-section of the first transistor T1, the third transistor T3, the first capacitor Cst, and the second capacitor Chold of the pixel PX2ij shown in FIG. 12.

A cross-section of the first transistor T1, the first capacitor Cst, and the second capacitor Chold of the pixel PX2ij shown in FIG. 14 is similar to a cross-section of the first transistor T1, the first capacitor Cst, and the second capacitor Chold of the pixel PXij shown in FIG. 5, and thus, any repetitive detailed description of the same or like elements are those described above with reference to FIG. 5 will be omitted or simplified to avoid redundancy.

In an embodiment, as illustrated in FIG. 14, a conductive layer (hereinafter, referred to as a "third conductive layer") is disposed on the second insulating layer 20. The third conductive layer may include a plurality of conductive patterns. In an embodiment, the third conductive layer may include a lower gate electrode G3-L and the first conductive pattern MP1 of the third transistor T3. The lower gate electrode G3-L is spaced from the first conductive pattern MP1. In a cross-sectional view, the first conductive pattern MP1 overlaps the gate electrode G1 of the first transistor T1.

A semiconductor layer is disposed on the fourth insulating layer 40. The semiconductor layer may include a plurality of semiconductor patterns. The semiconductor pattern may include metal oxide. The first electrode D3, a semiconductor area A3, and the second electrode S3 of the third transistor T3 are formed from the semiconductor patterns. The first electrode D3 and the second electrode S3 of the third transistor T3 extend in opposite directions from the semiconductor area A3.

The fifth insulating layer 50 covering the semiconductor pattern is disposed on the fourth insulating layer 40.

A conductive layer (hereinafter, referred to as a "fifth conductive layer") is disposed on the fifth conductive layer 50. The fifth conductive layer may include a plurality of conductive patterns. In an embodiment, the fifth conductive layer may include the gate electrode G3 of the third transistor T3.

The sixth insulating layer 60 covering the gate electrode G3 of the third transistor T3 is disposed on the fifth insulating layer 50.

A conductive layer (hereinafter, referred to as a "sixth conductive layer") is disposed on the sixth insulating layer 60. The sixth conductive layer may include a plurality of connection electrodes. FIG. 14 shows the fifth to tenth connection electrodes CNE5 to CNE10.

The ninth connection electrode CNE9 is connected to the sixth connection electrode CNE6 through the contact hole 109 defined through the fourth to sixth insulating layers 40 to 60. In addition, the ninth connection electrode CNE9 is connected to the second electrode S3 of the third transistor T3 through a contact hole 110 defined through the fifth and sixth insulating layers 50 and 60. The ninth connection electrode CNE9 may be the second node N2 illustrated in FIG. 12.

The tenth connection electrode CNE10 is connected to the first electrode D3 of the third transistor T3 through the contact hole 111 defined through the fifth to sixth insulating layers 50 and 60.

The gate electrode G1 of the first transistor T1 defines the first electrode E1-1 of the first capacitor Cst. The first conductive pattern MP1 defines the second electrode E1-2 of the first capacitor Cst and the first electrode E2-1 of the second capacitor Chold.

The second conductive pattern MP2 defines the second electrode E2-2 of the second capacitor Chold shown in FIG. 12.

In such an embodiment, capacitance of each of the first capacitor Cst and the second capacitor Chold may be sufficiently secured, and pixel density may be increased, by forming the gate electrode G1 of the first transistor T1, the second conductive pattern MP2, and the third conductive pattern MP3 to overlap one another.

In embodiments of the invention, a pixel of a display device having such a configuration may separate a compensation period for compensating for a threshold voltage of a first transistor and a write period for storing a data signal in a first capacitor on a time axis, by including first and second capacitors. In such embodiments, the capacitance of each of the first capacitor and the second capacitor may be sufficiently secured by forming the first transistor, the first capacitor, and the second capacitor to overlap one another.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a display panel including a plurality of insulating layers and a pixel electrically connected to a data line and a scan line,
wherein the pixel includes:
a light emitting element;
a first transistor including a first electrode, a second electrode electrically connected to the light emitting element, and a gate electrode connected to a first node;
a second transistor including a first electrode connected to the data line, a second electrode connected to a second node, and a gate electrode electrically connected to the scan line;
a first capacitor defined by the gate electrode of the first transistor and a first conductive pattern; and
a second capacitor defined by the first conductive pattern and a second conductive pattern,
wherein the plurality of insulating layers includes a first insulating layer, a second insulating layer disposed on the first insulating layer, and a third insulating layer disposed on the second insulating layer,
wherein the first conductive pattern is interposed between the first insulating layer and the second insulating layer,
wherein the second conductive pattern is interposed between the second insulating layer and the third insulating layer, and
wherein the second electrode of the second transistor is electrically connected to the first conductive pattern, and
wherein a first opening and a second opening are defined through the second conductive pattern to overlap the gate electrode of the first transistor in a thickness direction of the display panel.

2. The display device of claim 1, wherein the pixel further includes a first connection electrode disposed in the first opening and electrically connected to the first conductive pattern and the second electrode of the second transistor.

3. The display device of claim 2, wherein the second electrode of the second transistor is connected to the first connection electrode through a first contact hole defined through the third insulating layer.

4. The display device of claim 1, wherein the gate electrode of the first transistor, the first conductive pattern, and the second conductive pattern overlap one another in thickness direction of the display panel.

5. The display device of claim 1,
wherein each of the first transistor and the second transistor includes a semiconductor area, and
wherein the semiconductor area of the first transistor includes a silicon semiconductor, and the semiconductor area of the second transistor includes metal oxide.

6. The display device of claim 1, wherein the pixel further includes:
a third transistor including a first electrode connected to the first node, a second electrode, a semiconductor area, and a gate electrode electrically connected to the scan line.

7. The display device of claim 6,
wherein a third opening is defined through the first conductive pattern, and
wherein the second opening overlaps the third opening in the thickness direction of the display panel.

8. The display device of claim 7,
wherein the pixel further includes a first connection electrode disposed in the first opening and electrically connected to the first conductive pattern and the second electrode of the second transistor, and a second connection electrode disposed in the second opening and electrically connected to the first connection electrode,
wherein the first connection electrode is electrically connected to the gate electrode of the first transistor through a contact hole defined through the first insulating layer, and
wherein the first electrode of the third transistor is electrically connected to the second connection electrode through a second contact hole defined through the third insulating layer.

9. The display device of claim 6, wherein the semiconductor area of the third transistor includes metal oxide.

10. The display device of claim 6, wherein the pixel further includes:
a fourth transistor including a first electrode connected to the second electrode of the first transistor, a second electrode connected to the second electrode of the third transistor, and a gate electrode connected to another scan line.

11. The display device of claim 1, wherein the pixel further includes:
a third capacitor connected between the second node and another scan line.

12. A display device comprising:
a display panel including a plurality of insulating layers, and a pixel electrically connected to a data line, a first scan line and a second scan line,
wherein the pixel includes:
a light emitting element;
a first transistor including a first electrode, a second electrode electrically connected to the light emitting element, and a gate electrode connected to a first node;

a second transistor including a first electrode connected to the data line, a second electrode connected to the first electrode of the first transistor, and a gate electrode electrically connected to the first scan line;

a third transistor including a first electrode connected to the first electrode of the first transistor, a second electrode, and a gate electrode electrically connected to the second scan line;

a first capacitor defined by the gate electrode of the first transistor and a first conductive pattern; and a second capacitor defined by the first conductive pattern and a second conductive pattern, wherein the plurality of insulating layers includes a first insulating layer, a second insulating layer disposed on the first insulating layer, and a third insulating layer disposed on the second insulating layer, wherein the gate electrode of the first transistor is disposed under the first insulating layer, wherein the first conductive pattern is interposed between the first insulating layer and the second insulating layer, wherein the second conductive pattern is interposed between the second insulating layer and the third insulating layer, wherein the second electrode of the third transistor is electrically connected to the first conductive pattern, and wherein a first opening and a second opening are defined through the second conductive pattern to overlap the gate electrode of the first transistor in a thickness direction of the display panel.

13. The display device of claim 12, wherein the pixel further includes a first connection electrode disposed in the first opening and electrically connected to the first conductive pattern and the second electrode of the third transistor.

14. The display device of claim 13, wherein the second electrode of the third transistor is connected to the first connection electrode through a first contact hole defined through the third insulating layer.

15. The display device of claim 12, wherein the gate electrode of the first transistor, the first conductive pattern, and the second conductive pattern overlap one another in the thickness direction of the display panel.

16. The display device of claim 12, wherein each of the first to third transistors includes a semiconductor area, wherein each of the semiconductor area of the first transistor and the semiconductor area of the second transistor includes a silicon semiconductor, and wherein the semiconductor area of the third transistor includes metal oxide.

17. The display device of claim 12, wherein the pixel further includes:

a fourth transistor including a first electrode connected to the first node, a second electrode, a semiconductor area, and a gate electrode electrically connected to the second scan line.

18. The display device of claim 17, wherein a third opening is defined through the first conductive pattern, and wherein the pixel further includes a first connection electrode disposed in the first opening and electrically connected to the first conductive pattern and the second electrode of the third transistor, and a second connection electrode disposed in the second opening and electrically connected to the first connection electrode, wherein the first connection electrode is electrically connected to the gate electrode of the first transistor through a contact hole defined through the first insulating layer, and wherein the first electrode of the fourth transistor is electrically connected to the second connection electrode through a second contact hole defined through the third insulating layer.

* * * * *